United States Patent
D'Evelyn et al.

(10) Patent No.: US 8,618,560 B2
(45) Date of Patent: Dec. 31, 2013

(54) POLARIZED WHITE LIGHT DEVICES USING NON-POLAR OR SEMIPOLAR GALLIUM CONTAINING MATERIALS AND TRANSPARENT PHOSPHORS

(71) Applicant: Soraa, Inc., Fremont, CA (US)

(72) Inventors: Mark P. D'Evelyn, Santa Barbara, CA (US); Rajat Sharma, Goleta, CA (US); Eric M. Hall, Goleta, CA (US); Daniel F. Feezell, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/623,788

(22) Filed: Sep. 20, 2012

(65) Prior Publication Data

US 2013/0270516 A1    Oct. 17, 2013

Related U.S. Application Data

(63) Continuation of application No. 12/754,886, filed on Apr. 6, 2010, now Pat. No. 8,299,473.

(60) Provisional application No. 61/167,447, filed on Apr. 7, 2009.

(51) Int. Cl.
*H01L 27/15* (2006.01)
*H01L 33/00* (2010.01)

(52) U.S. Cl.
USPC .............................................. 257/79; 257/99

(58) Field of Classification Search
USPC ...................................................... 257/79, 99
See application file for complete search history.

(56) References Cited

U.S. PATENT DOCUMENTS

| | | | |
|---|---|---|---|
| 4,065,688 A | 12/1977 | Thornton | |
| 6,335,771 B1 | 1/2002 | Hiraishi | |
| 6,498,355 B1 | 12/2002 | Harrah et al. | |
| 6,509,651 B1 | 1/2003 | Matsubara et al. | |
| 6,533,874 B1 | 3/2003 | Vaudo et al. | |
| 6,784,463 B2 | 8/2004 | Camras et al. | |
| 6,787,814 B2 | 9/2004 | Udagawa | |

(Continued)

FOREIGN PATENT DOCUMENTS

WO    2007/004495    1/2007
WO    2012/016033    2/2012

OTHER PUBLICATIONS

Cich et al., 'Bulk GaN based violet light-emitting diodes with high efficiency at very high current density', Applied Physics Letters, Nov. 29, 2012, pp. 223509-1-223509-3.

(Continued)

*Primary Examiner* — Long K Tran
(74) *Attorney, Agent, or Firm* — Kilpatrick Townsend & Stockton LLP

(57) ABSTRACT

A light emitting device includes a substrate having a surface region and a light emitting diode overlying the surface region. The light emitting diode is fabricated on a semipolar or non-polar GaN containing substrate and emits electromagnetic radiation of a first wavelength. The diode includes a quantum well region characterized by an electron wave function and a hole wave function. The electron wave function and the hole wave function are substantially overlapped within a predetermined spatial region of the quantum well region. The device has a transparent phosphor overlying the light emitting diode. The phosphor is excited by the substantially polarized emission to emit electromagnetic radiation of a second wavelength.

27 Claims, 14 Drawing Sheets

(56) References Cited

U.S. PATENT DOCUMENTS

| | | | |
|---|---|---|---|
| 6,809,781 B2 | 10/2004 | Setlur et al. | |
| 6,956,246 B1 | 10/2005 | Epler et al. | |
| 7,001,577 B2 | 2/2006 | Zimmerman et al. | |
| 7,012,279 B2 | 3/2006 | Wierer Jr. et al. | |
| 7,112,829 B2 | 9/2006 | Picard et al. | |
| 7,119,372 B2 | 10/2006 | Stokes et al. | |
| 7,128,849 B2 | 10/2006 | Setlur et al. | |
| 7,198,671 B2 | 4/2007 | Ueda | |
| 7,252,712 B2 | 8/2007 | Dwilinski et al. | |
| 7,285,801 B2 | 10/2007 | Eliashevich et al. | |
| 7,341,880 B2 | 3/2008 | Erchak et al. | |
| 7,358,543 B2 | 4/2008 | Chua et al. | |
| 7,420,261 B2 | 9/2008 | Dwilinski et al. | |
| 7,646,033 B2 * | 1/2010 | Tran et al. | 257/94 |
| 7,733,571 B1 | 6/2010 | Li | |
| 7,759,710 B1 | 7/2010 | Chiu et al. | |
| 7,816,238 B2 | 10/2010 | Osada et al. | |
| 7,858,408 B2 | 12/2010 | Mueller et al. | |
| 7,862,761 B2 | 1/2011 | Okushima et al. | |
| 7,871,839 B2 | 1/2011 | Lee et al. | |
| 7,923,741 B1 | 4/2011 | Zhai et al. | |
| 7,976,630 B2 | 7/2011 | Poblenz et al. | |
| 8,021,481 B2 | 9/2011 | D'Evelyn | |
| 8,044,412 B2 | 10/2011 | Murphy et al. | |
| 8,048,225 B2 | 11/2011 | Poblenz et al. | |
| 8,097,081 B2 | 1/2012 | D'Evelyn | |
| 8,148,801 B2 | 4/2012 | D'Evelyn | |
| 8,188,504 B2 | 5/2012 | Lee | |
| 8,198,643 B2 | 6/2012 | Lee et al. | |
| 8,207,548 B2 | 6/2012 | Nagai | |
| 8,207,554 B2 | 6/2012 | Shum | |
| 8,247,886 B1 | 8/2012 | Sharma et al. | |
| 8,252,662 B1 | 8/2012 | Poblenz et al. | |
| 8,284,810 B1 | 10/2012 | Sharma et al. | |
| 8,293,551 B2 | 10/2012 | Sharma et al. | |
| 8,303,710 B2 | 11/2012 | D'Evelyn | |
| 8,306,081 B1 | 11/2012 | Schmidt et al. | |
| 8,323,405 B2 | 12/2012 | D'Evelyn | |
| 8,329,511 B2 | 12/2012 | D'Evelyn | |
| 2001/0009134 A1 | 7/2001 | Kim et al. | |
| 2001/0043042 A1 | 11/2001 | Murazaki et al. | |
| 2002/0070416 A1 | 6/2002 | Morse et al. | |
| 2002/0182768 A1 | 12/2002 | Morse et al. | |
| 2003/0047076 A1 | 3/2003 | Liu | |
| 2003/0164507 A1 | 9/2003 | Edmond et al. | |
| 2004/0023427 A1 | 2/2004 | Chua et al. | |
| 2004/0070004 A1 | 4/2004 | Eliashevich et al. | |
| 2004/0080256 A1 | 4/2004 | Hampden-Smith et al. | |
| 2004/0124435 A1 | 7/2004 | D'Evelyn et al. | |
| 2004/0251471 A1 | 12/2004 | Dwilinski et al. | |
| 2005/0087753 A1 | 4/2005 | D'Evelyn et al. | |
| 2005/0121679 A1 | 6/2005 | Nagahama et al. | |
| 2005/0152820 A1 | 7/2005 | D'Evelyn et al. | |
| 2005/0167680 A1 | 8/2005 | Shei et al. | |
| 2005/0199899 A1 | 9/2005 | Lin et al. | |
| 2005/0224830 A1 | 10/2005 | Blonder et al. | |
| 2005/0263791 A1 | 12/2005 | Yanagihara et al. | |
| 2006/0032428 A1 | 2/2006 | Dwilinski et al. | |
| 2006/0037530 A1 | 2/2006 | Dwilinski et al. | |
| 2006/0038542 A1 | 2/2006 | Park et al. | |
| 2006/0060872 A1 | 3/2006 | Edmond et al. | |
| 2006/0079082 A1 | 4/2006 | Bruhns et al. | |
| 2006/0118799 A1 | 6/2006 | D'Evelyn et al. | |
| 2006/0163589 A1 | 7/2006 | Fan et al. | |
| 2006/0169993 A1 | 8/2006 | Fan et al. | |
| 2006/0189098 A1 | 8/2006 | Edmond | |
| 2006/0205199 A1 | 9/2006 | Baker et al. | |
| 2006/0273339 A1 | 12/2006 | Steigerwald et al. | |
| 2007/0045200 A1 | 3/2007 | Moon et al. | |
| 2007/0096239 A1 | 5/2007 | Cao et al. | |
| 2007/0114569 A1 | 5/2007 | Wu et al. | |
| 2007/0121690 A1 | 5/2007 | Fujii et al. | |
| 2007/0131967 A1 | 6/2007 | Kawaguchi et al. | |
| 2007/0202624 A1 | 8/2007 | Yoon et al. | |
| 2007/0215033 A1 | 9/2007 | Imaeda et al. | |
| 2007/0228404 A1 * | 10/2007 | Tran et al. | 257/98 |
| 2008/0006831 A1 | 1/2008 | Ng | |
| 2008/0023691 A1 | 1/2008 | Jang et al. | |
| 2008/0025360 A1 | 1/2008 | Eichler et al. | |
| 2008/0073660 A1 | 3/2008 | Ohno et al. | |
| 2008/0083929 A1 | 4/2008 | Fan et al. | |
| 2008/0099777 A1 | 5/2008 | Erchak et al. | |
| 2008/0106212 A1 | 5/2008 | Yen et al. | |
| 2008/0121906 A1 | 5/2008 | Yakushiji | |
| 2008/0128752 A1 | 6/2008 | Wu | |
| 2008/0179607 A1 | 7/2008 | DenBaars et al. | |
| 2008/0194054 A1 | 8/2008 | Lin et al. | |
| 2008/0198881 A1 | 8/2008 | Farrell et al. | |
| 2008/0210958 A1 | 9/2008 | Senda et al. | |
| 2008/0211416 A1 | 9/2008 | Negley et al. | |
| 2008/0230765 A1 | 9/2008 | Yoon et al. | |
| 2008/0272463 A1 | 11/2008 | Butcher et al. | |
| 2008/0282978 A1 | 11/2008 | Butcher et al. | |
| 2008/0298409 A1 | 12/2008 | Yamashita et al. | |
| 2008/0303033 A1 | 12/2008 | Brandes | |
| 2009/0065798 A1 | 3/2009 | Masui et al. | |
| 2009/0078955 A1 | 3/2009 | Fan et al. | |
| 2009/0081857 A1 | 3/2009 | Hanser et al. | |
| 2009/0086475 A1 | 4/2009 | Caruso et al. | |
| 2009/0140279 A1 | 6/2009 | Zimmerman et al. | |
| 2009/0146170 A1 | 6/2009 | Zhong et al. | |
| 2009/0194796 A1 | 8/2009 | Hashimoto et al. | |
| 2009/0206354 A1 | 8/2009 | Kitano et al. | |
| 2009/0227056 A1 | 9/2009 | Kyono et al. | |
| 2009/0250686 A1 | 10/2009 | Sato et al. | |
| 2009/0252191 A1 | 10/2009 | Kubota et al. | |
| 2009/0267098 A1 | 10/2009 | Choi | |
| 2009/0273005 A1 | 11/2009 | Lin | |
| 2009/0309110 A1 | 12/2009 | Raring et al. | |
| 2009/0321778 A1 | 12/2009 | Chen et al. | |
| 2010/0006873 A1 | 1/2010 | Raring et al. | |
| 2010/0032691 A1 | 2/2010 | Kim | |
| 2010/0055819 A1 | 3/2010 | Ohba et al. | |
| 2010/0108985 A1 | 5/2010 | Chung et al. | |
| 2010/0109030 A1 | 5/2010 | Krames et al. | |
| 2010/0117101 A1 | 5/2010 | Kim et al. | |
| 2010/0117118 A1 | 5/2010 | Dabiran et al. | |
| 2011/0017298 A1 | 1/2011 | Lee | |
| 2011/0100291 A1 | 5/2011 | D'Evelyn | |
| 2011/0108081 A1 | 5/2011 | Werthen et al. | |
| 2011/0175200 A1 | 7/2011 | Yoshida | |
| 2011/0182056 A1 | 7/2011 | Trottier et al. | |
| 2011/0183498 A1 | 7/2011 | D'Evelyn | |
| 2011/0186874 A1 | 8/2011 | Shum | |
| 2011/0220912 A1 | 9/2011 | D'Evelyn | |
| 2011/0256693 A1 | 10/2011 | D'Evelyn et al. | |
| 2011/0262773 A1 | 10/2011 | Poblenz et al. | |
| 2011/0279054 A1 | 11/2011 | Katona et al. | |
| 2011/0317397 A1 | 12/2011 | Trottier et al. | |
| 2012/0000415 A1 | 1/2012 | D'Evelyn et al. | |
| 2012/0007102 A1 | 1/2012 | Feezell et al. | |
| 2012/0073494 A1 | 3/2012 | D'Evelyn | |
| 2012/0091465 A1 | 4/2012 | Krames et al. | |
| 2012/0118223 A1 | 5/2012 | D'Evelyn | |
| 2012/0135553 A1 | 5/2012 | Felker et al. | |
| 2012/0137966 A1 | 6/2012 | D'Evelyn et al. | |
| 2012/0187412 A1 | 7/2012 | D'Evelyn et al. | |
| 2012/0199841 A1 | 8/2012 | Batres et al. | |
| 2012/0199952 A1 | 8/2012 | D'Evelyn et al. | |
| 2012/0288974 A1 | 11/2012 | Sharma et al. | |
| 2013/0022758 A1 | 1/2013 | Trottier | |
| 2013/0026483 A1 | 1/2013 | Sharma et al. | |

OTHER PUBLICATIONS

USPTO Office Action for U.S. Appl. No. 12/481,543 dated Jun. 27, 2011.

USPTO Notice of Allowance for U.S. Appl. No. 12/569,844 dated Mar. 7, 2013.

USPTO Office Action for U.S. Appl. No. 12/634,665 dated Mar. 12, 2012.

USPTO Notice of Allowance for U.S. Appl. No. 12/720,593 dated Jul. 11, 2012.

(56) References Cited

OTHER PUBLICATIONS

USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/749,476 dated Jun. 26, 2012.
USPTO Office Action for U.S. Appl. No. 12/861,765 dated Jul. 2, 2012.
USPTO Office Action for U.S. Appl. No. 12/861,765 dated Mar. 7, 2013.
USPTO Office Action for U.S. Appl. No. 12/879,784 dated Jan. 25, 2012.
USPTO Notice of Allowance for U.S. Appl. No. 12/879,784 dated Apr. 3, 2012.
USPTO Office Action for U.S. Appl. No. 12/880,889 dated Feb. 27, 2012.
USPTO Office Action for U.S. Appl. No. 12/880,889 dated Sep. 19, 2012.
USPTO Office Action for U.S. Appl. No. 12/936,238 dated Aug. 30, 2012.
USPTO Office Action for U.S. Appl. No. 12/936,238 dated Jan. 30, 2013.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/019,897 dated Mar. 30, 2012.
USPTO Notice of Allowance for U.S. Appl. No. 13/163,482 dated Jul. 31, 2012.
USPTO Office Action for U.S. Appl. No. 13/465,976 dated Aug. 16, 2012.
Choi et al., '2.5λ microcavity InGaN light-emitting diodes fabricated by a selective dry-etch thinning process', Applied Physics Letters, 2007, 91(6), 061120.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum, Mar. 28, 2011, pp. 1.
Pattison et al., 'Gallium Nitride Based Microcavity Light Emitting Diodes With 2λ Effective Cavity Thickness', Applied Physics Letters, vol. 90, Issue 3, 031111 (2007) 3pg.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Notice of Allowance for U.S. Appl. No. 12/478,736 dated Oct. 9, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/497,969 dated Jul. 5, 2012.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,843 dated Sep. 10, 2012.
USPTO Office Action for U.S. Appl. No. 12/534,844 dated Sep. 16, 2010.
USPTO Office Action for U.S. Appl. No. 12/534,844 dated Feb. 4, 2011.
USPTO Notice of Allowance for U.S. Appl. No. 12/534,849 dated Jul. 31, 2012.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Apr. 25, 2012.
USPTO Office Action for U.S. Appl. No. 12/634,665 dated Oct. 1, 2012.
USPTO Notice of Allowance for U.S. Appl. No. 12/785,404 dated Jul. 16, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Aug. 17, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Notice of Allowance for U.S. Appl. No. 13/425,304 dated Aug. 22, 2012.

* cited by examiner

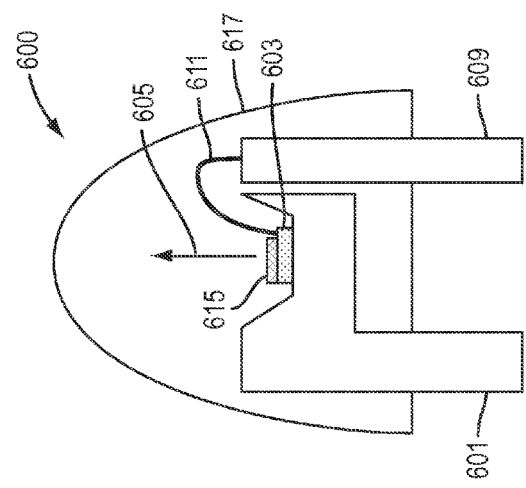
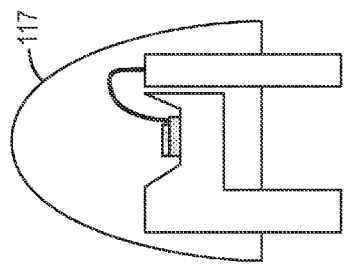
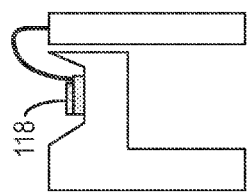
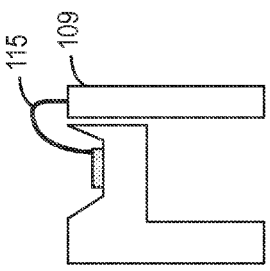

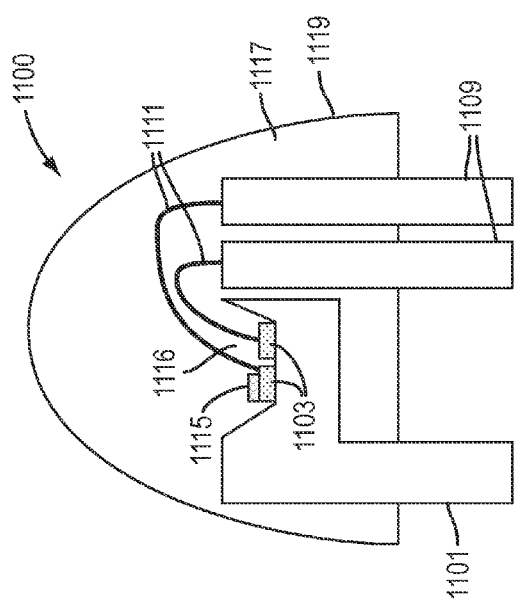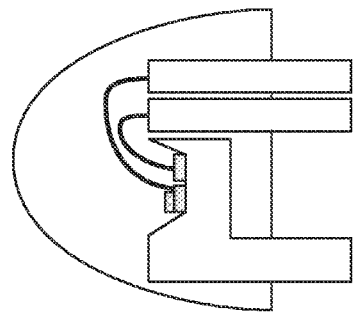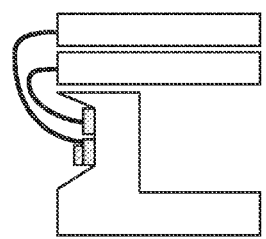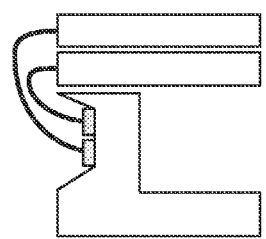

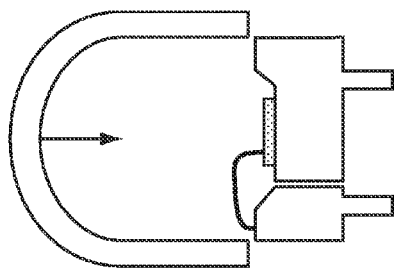
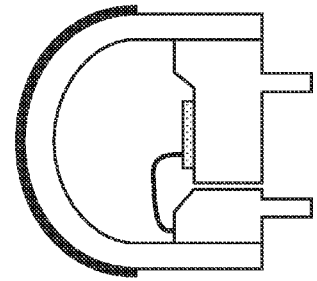
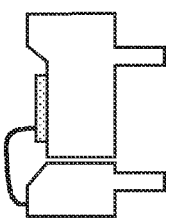
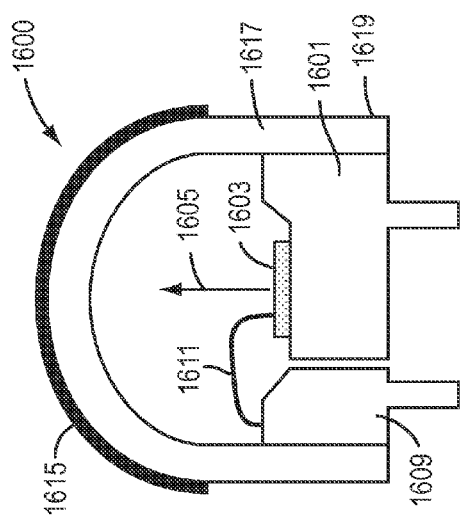
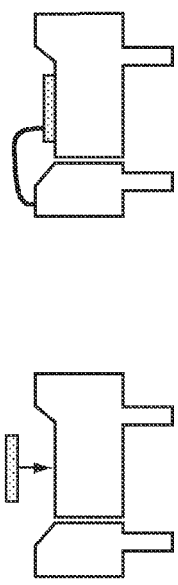

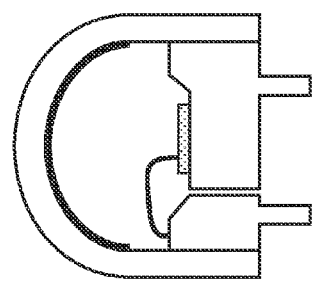
FIG. 21
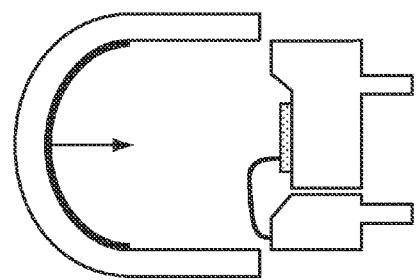
FIG. 24
FIG. 25
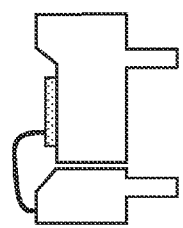
FIG. 23
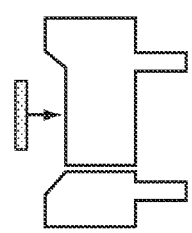
FIG. 22

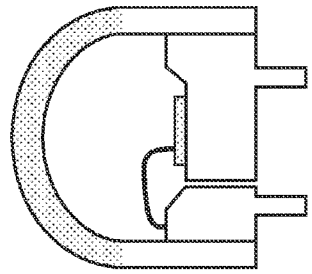
FIG. 30
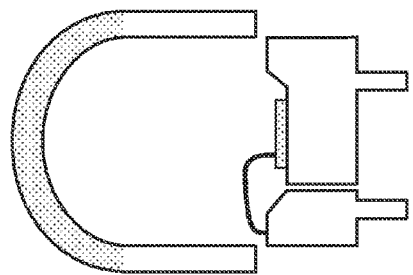
FIG. 29
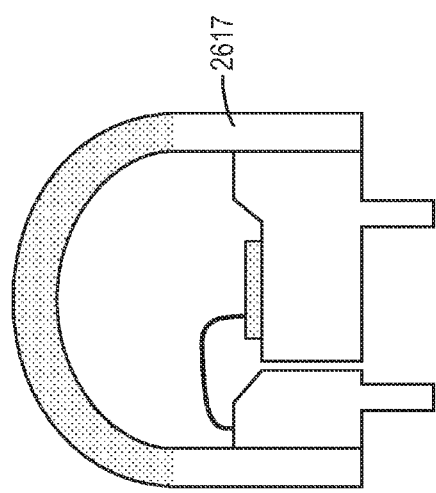
FIG. 26
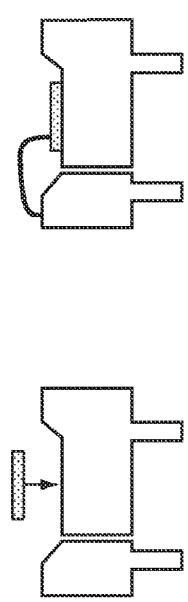
FIG. 28
FIG. 27

POLARIZED WHITE LIGHT DEVICES USING NON-POLAR OR SEMIPOLAR GALLIUM CONTAINING MATERIALS AND TRANSPARENT PHOSPHORS

CROSS-REFERENCES TO RELATED APPLICATIONS

This application is a continuation application of U.S. application Ser. No. 12/754,886 filed on Apr. 6, 2010, now allowed, which claims priority to U.S. Provisional Application No. 61/167,447 filed on Apr. 7, 2009, each of which is incorporated by reference in its entirety.

BACKGROUND OF THE INVENTION

This invention relates generally to lighting techniques. More specifically, embodiments of the invention include techniques for combining one or more colored light emitting diodes (LEDs), such as violet, blue, blue and yellow, or blue and green, fabricated on bulk semipolar or nonpolar materials with use of materials such as phosphors, which emit light. In other embodiments, the entities may be also any wavelength conversion material(s) or energy conversion material(s), or the like. Herein the term "phosphor" is used to include all such types of materials. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. In particular, more than 90% of the energy used for the conventional light bulb dissipates as thermal energy. Additionally, the conventional light bulb routinely fails, often due to thermal expansion and contraction, of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

Light emission from GaN-based LEDs is typically unpolarized. Some applications, for example, liquid crystal displays such as are employed in televisions, computer monitors, and other large-area displays, require that the light source be polarized. Polarization is typically achieved by employing a conventional polarizer together with an unpolarized light source. However, this approach wastes more than 50% of the energy of the light source, increasing cost and decreasing efficiency, and results in increased complexity. If the light source had a modest degree of polarization the polarizer could still be employed, but the efficiency would be greater because a smaller fraction of the emitted light would be wasted. If the polarization of the source were sufficiently high it may be possible to omit the polarizer altogether, increasing efficiency and decreasing cost and system complexity.

BRIEF SUMMARY OF THE INVENTION

According to the present invention, techniques for improved lighting are provided. More specifically, embodiments of the invention include techniques for combining one or more colored LED devices, such as violet, blue, blue and yellow, or blue and green, fabricated on bulk semipolar or nonpolar materials with use of entities such as phosphors, which emit light. In other embodiments, the entities may be also any wavelength conversion material(s) or energy conversion material(s), or the like. By way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, the present invention provides a packaged light emitting device. The packaged device includes a substrate member comprising a surface region. At least one light emitting diode overlies the surface region. At least one of the light emitting diodes is fabricated on a semipolar or nonpolar GaN containing substrate. The at least one light emitting diode fabricated on the semipolar or nonpolar GaN containing substrate emit substantially polarized emission of one or more first wavelengths. In a specific embodiment, the device also has an optically transparent member coupled to the at least one light emitting diode. An optical path is provided between the at least one light emitting diode and the optically transparent member. In a specific embodiment, a thickness of one or more entities is formed overlying the optically transparent member. Alternatively, the one or more entities are formed within the optically transparent member or underlying the optically transparent member or any combination of these configurations. The one or more of the entities are excited by the substantially polarized emission to emit electromagnetic radiation at one or more second wavelengths.

In a specific embodiment, the present invention includes device configurations having different spatial locations for the thickness of the one or more entities. In a specific embodiment, the thickness of the one or more entities is formed within the optically transparent member. Alternatively, the thickness of the one or more entities is formed underlying the optically transparent member according to a specific embodiment. In yet another alternative specific embodiment, the thickness of the one or more entities is formed within a spatial region of the light path between the at least one light emitting diode and the optically transparent member. Still further, the present device can have any combination of these configurations, and others. Of course, there can be variations, modifications, and alternatives.

In yet another alternative specific embodiment, the present invention provides a packaged light emitting device. The device includes a substrate member comprising a surface region and at least one light emitting diode overlying the surface region. In a specific embodiment, at least one of the light emitting diode is fabricated on a semipolar or nonpolar GaN containing substrate. The at least one light emitting diode is fabricated on the semipolar or nonpolar GaN containing substrate emits substantially polarized emission of one or more first wavelengths. Preferably the light emitting diode includes a quantum well region characterized by an electron wave function and a hole wave function. In a specific embodiment, the electron wave function and the hole wave function are substantially overlapped within a predetermined spatial region of the quantum well region. In a specific embodiment, the device has a phosphor overlying the at least one light emitting diode device. The phosphor is excited by the substantially polarized emission and emitting electromagnetic radiation of one or more second wavelengths.

Still further, the present invention provides an optical device. The optical device includes at least one light emitting diode device. In a specific embodiment, at least one of the light emitting diode devices is provided on at least a semipolar or nonpolar GaN containing substrate and emits electromagnetic radiation of one or more first wavelengths. In a preferred embodiment, the at least one light emitting diode device has respective one or more emission surfaces. One or more transparent phosphor entities is overlying the one or more emission surfaces of the at least one light emitting diode device according to a specific embodiment. One or more of the entities is excited by emission from at least one of the light emitting diode devices to emit electromagnetic radiation at one or more second wavelengths according to a specific embodiment. At least one optical coupling region is provided between the one or more emission surfaces of the at least one light emitting diode device and the one or more transparent phosphor entities.

Moreover, the present invention provides a method for optical devices. The method includes emitting electromagnetic radiation of one or more first wavelengths provided from at least one or more emissive surfaces corresponding respectively to at least one light emitting diode device. At least one of the light emitting diode devices IS provided on at least a semipolar or nonpolar GaN containing substrate according to a specific embodiment. The method also includes subjecting one or more transparent phosphor entities overlying the one or more emission surfaces of the at least one light emitting diode device with at least the emission of the one or more first wavelengths of at least one of the light emitting diode devices according to a specific embodiment. The method includes emitting electromagnetic radiation at one or more second wavelengths excited from at least the one or more transparent phosphor entities according to one or more embodiments.

One or more benefits may be achieved using one or more of the specific embodiments. As an example, the present device and method provides for an improved lighting technique with improved efficiencies. In other embodiments, the present method and resulting structure are easier to implement using conventional technologies. In some embodiments, the present device and method provide polarized light at two or more wavelengths that are useful in displays and in conjunction with polarizing transmission filters. In a specific embodiment, the blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers, although there can also be some variations. In one or more preferred embodiments, the emitted light can have a polarization ratio of greater than zero, or 0.5 and greater, or 0.6 and greater, or 0.7 and greater, or 0.8 and greater, or 0.9 and greater, or 0.95 and greater. Depending upon the embodiment, one or more of these benefits can be achieved. These and other benefits are further described throughout the present specification and more particularly below.

The present invention achieves these benefits and others in the context of known process technology. Further understanding of the nature and advantages of the present invention may be realized by reference to this specification and the drawings.

BRIEF DESCRIPTION OF THE DRAWINGS

FIG. 6 is a simplified diagram of a packaged light emitting device using a recessed configuration according to an embodiment of the present invention;

FIGS. 7 through 10 illustrate a simplified method of assembling the light emitting device of FIG. 6 according to an embodiment of the present invention;

FIG. 11 is a simplified diagram of an alternative packaged light emitting device using multiple devices according to an embodiment of the present invention;

FIGS. 12 through 15 illustrate a simplified method of assembling the light emitting device of FIG. 11 according to an embodiment of the present invention;

FIG. 16 is a simplified diagram of yet an alternative packaged light emitting device using an optical path to a plane region according to an embodiment of the present invention;

FIGS. 17 through 20 illustrate a simplified method of assembling the light emitting device of FIG. 11 according to an embodiment of the present invention;

FIG. 21 is a simplified diagram of a yet an alternative packaged light emitting device using an optical path to a plane region and filler material according to an embodiment of the present invention;

FIGS. 22 through 25 illustrate a simplified method of assembling the light emitting device of FIG. 21 according to an embodiment of the present invention;

FIG. 26 is a simplified diagram of a yet an alternative packaged light emitting device using an optical path to a plane region according to an embodiment of the present invention;

FIGS. 27 through 30 illustrate a simplified method of assembling the light emitting device of FIG. 26 according to an embodiment of the present invention;

DETAILED DESCRIPTION OF THE INVENTION

Figure 1:
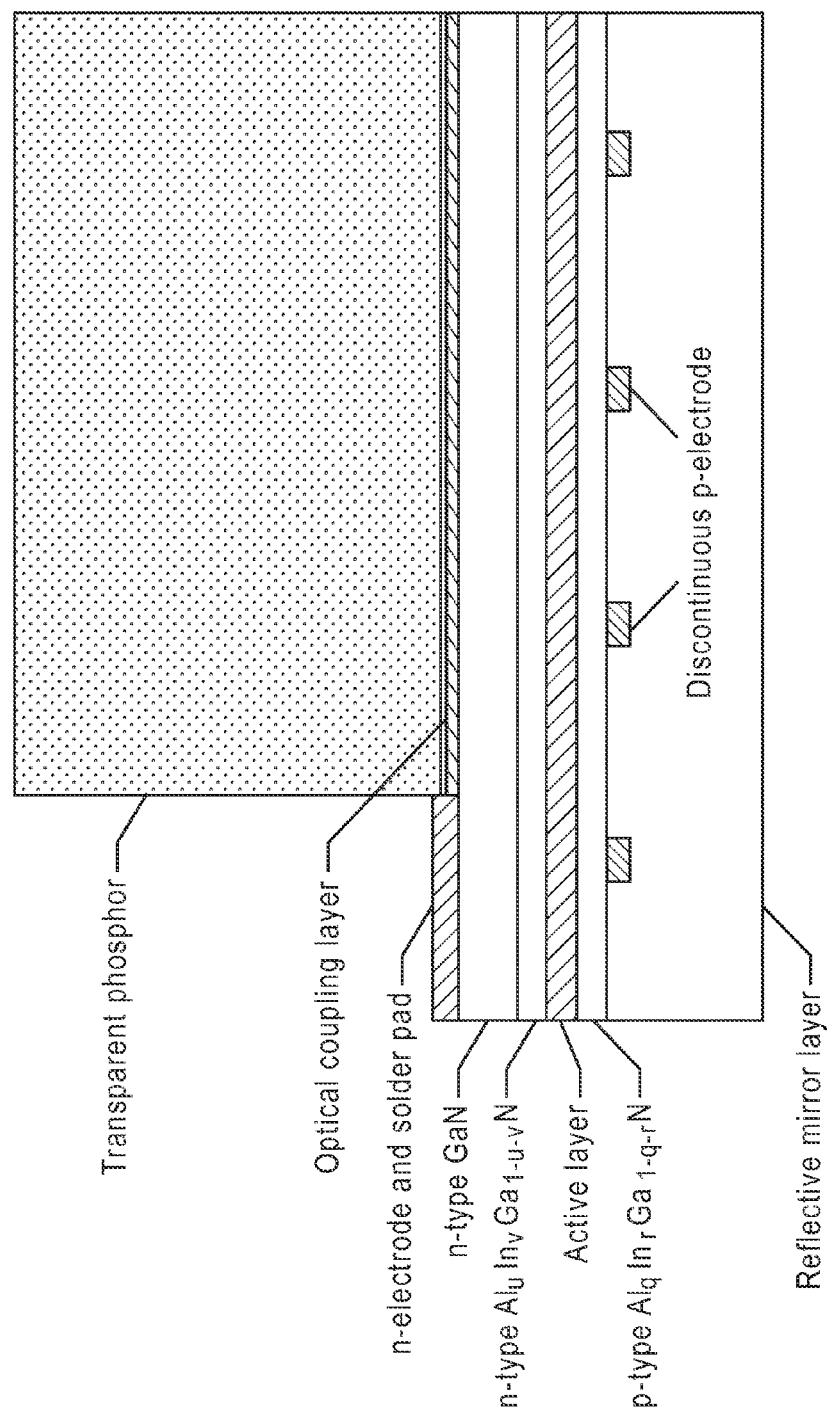
FIG. 1 is a simplified diagram of a light emitting diode coupled to a transparent phosphor according to an embodiment of the present invention.

According to the present invention, improved lighting technology is provided. More specifically, embodiments of the invention include techniques for combining one or more colored LED devices, such as violet, blue, blue and yellow, or blue and green, fabricated on bulk semipolar or nonpolar materials with use of entities such as phosphors (which include phosphorescent, luminescent or fluorescent materials), which emit light. In other embodiments, the entities may be also any wavelength conversion material(s) or energy conversion material(s), or the like. Merely by way of example, the invention can be applied to applications such as white lighting, multi-colored lighting, general illumination, decorative lighting, automotive and aircraft lamps, street lights, lighting for plant growth, indicator lights, lighting for flat panel displays and projection displays, other optoelectronic devices, and the like.

We have discovered that breakthroughs in the field of GaN-based optoelectronics have demonstrated the great potential of devices fabricated on bulk nonpolar and semipolar GaN substrates. The lack of strong polarization-induced electric fields that plague conventional devices on c-plane GaN leads to a enhanced radiative recombination efficiency in the light emitting InGaN layers. Furthermore, the nature of the electronic band structure and the anisotropic in-plane strain leads to highly polarized light emission, which will offer several advantages in applications such as projection and display backlighting.

Of particular importance to the field of lighting is the progress of light emitting diodes (LED) fabricated on nonpolar and semipolar GaN substrates. Such devices making use of InGaN light emitting layers have exhibited record output powers at extended operation wavelengths into the violet region (390-430 nm), the blue region (430-490 nm), the green region (490-560 nm), and the yellow region (560-600 nm). For example, a violet LED, with a peak emission wavelength of 402 nm, was recently fabricated on an m-plane (1-100) GaN substrate and demonstrated greater than 45% external quantum efficiency, despite having no light extraction enhancement features, and showed excellent performance at high current densities, with minimal roll-over [K.-C. Kim, M. C. Schmidt, H. Sato, F. Wu, N. Fellows, M. Saito, K. Fujito, J. S. Speck, S. Nakamura, and S. P. DenBaars, "Improved electroluminescence on nonpolar m-plane InGaN/GaN quantum well LEDs", Phys. Stat. Sol. (RRL) 1, No. 3, 125 (2007).]. Similarly, a blue LED, with a peak emission wavelength of 468 nm, exhibited excellent efficiency at high power densities and significantly less roll-over than is typically observed with c-plane LEDs [K. Iso, H. Yamada, H. Hirasawa, N. Fellows, M. Saito, K. Fujito, S. P. DenBaars, J. S. Speck, and S. Nakamura, "High brightness blue InGaN/GaN light emitting diode on nonpolar m-plane bulk GaN substrate", Japanese Journal of Applied Physics 46, L960 (2007).]. Two promising semipolar orientations are the (10-1-1) and (11-22) planes. These planes are inclined by 62.0 degrees and by 58.4 degrees, respectively, with respect to the c-plane. University of California, Santa Barbara (UCSB) has produced highly efficient LEDs on (10-1-1) GaN with over 65 mW output power at 100 mA for blue-emitting devices [H. Zhong, A. Tyagi, N. Fellows, F. Wu, R. B. Chung, M. Saito, K. Fujito, J. S. Speck, S. P. DenBaars, and S. Nakamura, "High power and high efficiency blue light emitting diode on freestanding semipolar (1011) bulk GaN substrate", Applied Physics Letters 90, 233504 (2007)] and on (11-22) GaN with over 35 mW output power at 100 mA for blue-green emitting devices [H. Zhong, A. Tyagi, N. N. Fellows, R. B. Chung, M. Saito, K. Fujito, J. S. Speck, S. P. DenBaars, and S. Nakamura, Electronics Lett. 43, 825 (2007)], over 15 mW of power at 100 mA for green-emitting devices [H. Sato, A. Tyagi, H. Zhong, N. Fellows, R. B. Chung, M. Saito, K. Fujito, J. S. Speck, S. P. DenBaars, and S. Nakamura, "High power and high efficiency green light emitting diode on free-standing semipolar (1122) bulk GaN substrate", Physical Status Solidi-Rapid Research Letters 1, 162 (2007)] and over 15 mW for yellow devices [H. Sato, R. B. Chung, H. Hirasawa, N. Fellows, H. Masui, F. Wu, M. Saito, K. Fujito, J. S. Speck, S. P. DenBaars, and S. Nakamura, "Optical properties of yellow light-emitting diodes grown on semipolar (1122) bulk GaN substrates," Applied Physics Letters 92, 221110 (2008).]. The UCSB group has shown that the indium incorporation on semipolar (11-22) GaN is comparable to or greater than that of c-plane GaN, which provides further promise for achieving high crystal quality extended wavelength emitting InGaN layers.

As described by Raring et al. in U.S. Patent Application Ser. No. 61/086,139, which is hereby incorporated by reference in its entirety, a non-polar or semi-polar GaN-based LED may be packaged along with at least one phosphor, producing a package LED that emits at least partially polarized light or in some cases polarized light. However, phosphors are often produced as powders, which may lead to scattered incident light and, typically, reduce any polarization that was initially present according to one or more configurations. As a consequence, even if some of the residual light from the exciting LED retains some degree of polarization, the light emitted by the phosphor may be approximately unpolarized or polarization may be reduced.

In a specific embodiment, the present invention provides methods and devices generally configured on semipolar and/or non-polar gallium nitride materials to emit polarized light using transparent phosphor entities. As merely an example, such phosphor entities are described in at least Murota et al. [Jpn. J. Appl. Phys. 41, L887 (2002)], who disclosed the use of a single crystal of cerium-doped yttrium aluminum garnet (YAG:Ce) as a phosphor. We believe that the extent of scattering is greatly reduced with a single crystal, and therefore the light emitted by the phosphor might be expected to retain some degree or substantially all of the polarization characteristic. However, single crystals are typically rather expensive relative to powders or ceramics and are difficult to fabricate into complex shapes, which are overcome in part by one or more embodiments of the present invention. Further details of the present method and device can be found throughout the present specification and more particularly below.

The present inventors have discovered that polarized phosphor emission may be achieved by combining a GaN-based LED emitting substantially polarized light with at least one sintered, polycrystalline phosphor that is substantially transparent. Like the single crystal phosphor, the transparent ceramic phosphor exhibits greatly reduced light scattering, enabling polarized emission. However, the transparent ceramic phosphor is much less expensive than the single crystal and can be fabricated in a much wider range of shapes at low cost. In a preferred embodiment, the ceramic phosphor is transparent, with little or no internal light scattering. In some embodiments, some internal light scattering may be present.

In one embodiment, a violet non-polar or semi-polar LED is packaged together with at least one transparent ceramic phosphor. In a preferred embodiment, the transparent ceramic phosphor comprises at least three phosphor compositions, emitting in the blue, the green, and the red. In another embodiment, a blue non-polar or semi-polar LED is packaged together with at least one transparent ceramic phosphor. In a preferred embodiment, the transparent ceramic phosphor comprises at least two phosphor compositions, emitting in the green and the red. In still another embodiment, a green or yellow non-polar or semi-polar LED is packaged together with a blue LED and at least one transparent ceramic phosphor. In a preferred embodiment, the transparent ceramic phosphor emits in the red. In a preferred embodiment, the blue LED constitutes a blue non-polar or semi-polar LED.

A non-polar or semi-polar LED may be fabricated on a bulk gallium nitride substrate. The gallium nitride substrate may be sliced from a boule that was grown by hydride vapor phase epitaxy or ammonothermally, according to methods known in the art. In one specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. The gallium nitride substrate may be cut, lapped, polished, and chemical-mechanically polished. The gallium nitride substrate orientation may be within ±5 degrees, ±2 degrees, ±1 degree, or ±0.5 degrees of the $\{1\ -1\ 0\ 0\}$ m plane, the $\{1\ 1\ -2\ 0\}$ a plane, the $\{1\ 1\ -2\ 2\}$ plane, the $\{1\ 1\ -2\ 3\}$ plane, the $\{1\ -1\ 0\ \pm 1\}$ plane, the $\{1\ -1\ 0\ \pm 2\}$ plane, or the $\{1\ -1\ 0\ \pm 3\}$ plane. The gallium nitride substrate may have a dislocation density in the plane of the large-area surface that is less than $10^6$ cm$^{-2}$, less than $10^5$ cm$^{-2}$, less than $10^4$ cm$^{-2}$, or less than $10^3$ cm$^{-2}$. The gallium nitride substrate may have a dislocation density in the c plane that is less than $10^6$ cm$^{-2}$, less than $10^5$ cm$^{-2}$, less than $10^4$ cm$^{-2}$, or less than $10^3$ cm$^{-2}$.

A homoepitaxial non-polar or semi-polar LED is fabricated on the gallium nitride substrate according to methods that are known in the art, for example, following the methods disclosed in U.S. Pat. No. 7,053,413, which is hereby incorporated by reference in its entirety. At least one $Al_xIn_yGa_{1-x-y}N$ layer, where $0 \le x \le 1$, $0 \le y \le 1$, and $0 < x+y < 1$, is deposited on the substrate, for example, following the methods disclosed by U.S. Pat. Nos. 7,338,828 and 7,220,324, which are hereby incorporated by reference in their entirety. The at least one $Al_xIn_yGa_{1-x-y}N$ layer may be deposited by metal-organic chemical vapor deposition, by molecular beam epitaxy, by hydride vapor phase epitaxy, or by a combination thereof. In one embodiment, the $Al_xIn_yGa_{1-x-y}N$ layer comprises an active layer or active region that preferentially emits light when an electrical current is passed through it. In one specific embodiment, the active layer comprises a single quantum well, with a thickness between about 0.5 nm and about 40 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In still another embodiment, the active region comprises a double heterostructure, with a thickness between about 40 nm and about 500 nm. In one specific embodiment, the active layer comprises an $In_yGa_{1-y}N$ layer, where $0 \le y \le 1$.

The LED may be flip-chip bonded, for example, as described in U.S. Patent Application Ser. No. 61/102,347, which is hereby incorporated by reference in its entirety according to one or more embodiments. Of course, there can be other variations, modifications, and alternatives.

A transparent ceramic phosphor may be fabricated by ceramic processing methods according to one or more embodiments. At least one ceramic powder may be provided, along with a doping source, a sintering aid, and a mixing promotor. The ceramic powder may comprise a plurality of phosphor entities. For example, to synthesize transparent YAG:Ce, $Y_2O_3$, $\alpha$-$Al_2O_3$, and $CeO_2$ powders may be provided. The powders may be formed by formation of a precursor by a wet chemical method, followed by drying and calcining The purity of each powder may be greater than 99%, greater than 99.9%, greater than 99.99%, or greater than 99.999%. The particle size of the powders may be between about 1 nm and about 20 micrometers, or between about 100 nanometers and about 5 micrometers. In some embodiments, at least one counter-ion is also provided. For example, in the case of YAG, Ca and/or Mg, which may be added as CaO, $CaCO_3$, or MgO powder, may be added to stabilize the presence of high-oxidation-state dopants in the YAG matrix. The powders may be blended in approximately a stoichiometric ratio. The dopant source may be provided at a level between about 0.01 weight percent and about 10 weight percent, or between about 0.3 weight percent and about 3 weight percent. The powders may be mixed. The mixing may be performed by an operation such as ball milling or attritor milling. High-purity alumina balls or rods may be provided as the milling media. In some embodiments, mixing is performed in a liquid carrier such as water, methanol, ethanol, isopropanol, acetone, hexane, or the like. A polymer, such as polyvinyl alcohol (PVA) or polyvinyl butyral (PVB) may be provided as an additional mixing promoter. An alklylsilane, such as tetraethoxysilane (TEOS) or 3-aminopropyl trimethoxysilane (APTMS) may be provided as a sintering aid, and may be added before or during mixing. The liquid carrier may be removed by drying the slurry after mixing. In some embodiments, mixed ceramic powder is formed directly by formation from precursors. For example, YAG precursors may be formed by co-precipitating aqueous $Y(NO_3)_3$ and $Al(NO_3)_3$ with ammonium hydrogen carbonate, followed by washing with ultrapure water and drying. In other embodiments, precursors are formed by preparing a chloride solution comprising the desired cations in the appropriate relative concentrations, forming precipitates by mixing with a solution such as ammonium oxalate or ammonium hydroxide, collecting the powder by sedimentation or filtration, drying, and heating a thermal decomposition temperature between about 600 degrees Celsius and about 1000 degrees Celsius. The dried ceramic powder may be ground and sieved. Disaggregation of the powder particles may be achieved by jet milling. The ceramic powders may be formed into a shaped green body by at least one of uniaxial pressing in a die, isostatic pressing, drying in a mold, and slip casting. A mold may comprise gypsum.

The ceramic green body may be sintered to transparency, forming a shaped transparent ceramic phosphor entity. For example, a transparent YAG ceramic may be obtained by sintering in vacuum, in air, or in an oxygen-containing atmosphere at temperatures between about 1400 degrees Celsius and about 1800 degrees Celsius for a predetermined time between about one hour and about 100 hours. In other embodiments, sintering is performed in an atmosphere comprising at least one of water vapor, ammonia, halogen, or a hydrogen halide. In some embodiments, sintering is initially performed at a higher, first temperature, followed by annealing at a second, lower temperature. For example, YAG may be sintered at a temperature of about 1750 degrees Celsius in oxygen or in vacuum for 5-20 hours, followed by annealing at approximately 1400 degrees Celsius for 5-20 hours in oxygen. The sintering may be performed in vacuum, at ambient pressure, or at elevated pressure. In some embodiments, sintering is performed by hot isostatic pressing. After sintering, the transparent ceramic phosphor may have a density greater than about 99.9% of the theoretical density.

After sintering, the grain size of the transparent ceramic phosphor may be between about 1 nanometer and about 200 micrometers, or between about 1 micrometer and about 40 micrometers. After sintering, at least one surface of the transparent ceramic phosphor may be ground and/or polished by methods that are known in the art. Polishing may comprise mechanical, chemical, and chemical-mechanical methods. Mechanical polishing may comprise lapping. Chemical polishing may comprise heating in an acid, such as at least one of phosphoric acid, sulfuric acid, hydrochloric acid, nitric acid, perchloric acid, hydrofluoric acid, or aqua regia. Chemical polishing may comprise heating in a base, such as sodium hydroxide or sodium amide. Chemical polishing may comprise heating in a molten flux, such as a metal halide, a metal nitrate, a metal fluoroborate, a metal nitride, a metal amide, a metal oxide, or a mixture or compound thereof. Chemical mechanical polishing may comprise abrasion using a slurry comprising an abrasive particle and a liquid carrier with a pH between about 1 and about 6.5 or between about 7.5 and about 12. The abrasive particle in the chemical mechanical polishing slurry may comprise alumina or silica. The polishing may provide a mirror finish. At least one coating may be applied to at least one surface of the transparent ceramic phosphor. The coating may have a refractive index that is intermediate between that of air and of the transparent ceramic phosphor, or that is intermediate between that of the transparent ceramic phosphor and the gallium nitride substrate, or at least one of the AlInGaN layers provided on the gallium nitride substrate.

In some embodiments, the composition of the transparent ceramic phosphor is approximately constant through the thickness of the phosphor. In other embodiments, the transparent phosphor has a laminate structure, in which the composition varies through the thickness of the phosphor. A laminate structure may be formed by sequential layering ceramic powder of varying compositions. The laminate structure may be formed by sequential uniaxial pressing of ceramic powders. The laminate structure may be formed by sequential slip casting of ceramic powders of varying compositions.

In some embodiments, at least one transparent ceramic phosphor comprises an oxide. In other embodiments, at least one transparent ceramic phosphor comprises a nitride. In still other embodiments, at least one transparent ceramic phosphor comprises an oxynitride, a halide, an oxyhalide, or an oxyhalidenitride.

In a specific embodiment, the present invention provides packages and devices including at least one non-polar or at least one semi-polar homoepitaxial LED placed on a substrate or submount. The at least one nonpolar or at least one semi-polar homoepitaxial LED may be mounted active-layer-up or may be flip-chip bonded, according to methods that are known in the art. In one specific embodiment, much of the bulk substrate is removed and the LED is flip-chip bonded, as described in U.S. Patent Application Ser. No. 61/102,347, which is hereby incorporated by reference in its entirety. The present packages and devices are combined with transparent or translucent ceramic phosphor entities to discharge white light according to a specific embodiment. Further details of the present packages and methods can be found throughout the present specification and more particularly below.

FIG. 1 is a simplified diagram of a nonpolar or semi-polar LED coupled to a transparent phosphor. An optical coupling layer is placed on at least one surface of a nonpolar or semi-polar LED. The optical coupling layer may comprise at least one of an epoxy, a silicone, a glass, or another material that is substantially transparent at the emission wavelength of the LED and is liquid or has a glass transition temperature less than about 500 degrees Celsius. The refractive index of the optical coupling layer may be between 1.0 and 2.5, between 1.2 and 2.0, or between 1.3 and 1.9. A transparent phosphor is placed in direct contact with the optical coupling layer. In an alternate embodiment, an optical coupling layer is placed on at least one surface of a transparent phosphor. In preferred embodiments, substantially no bubbles, dust, or other materials that might scatter light are present within the optical coupling layer or its interfaces with the LED or the transparent phosphor. In some embodiments, a thin film of the optical coupling layer material is applied to at least one surface of the LED and at least one surface of the transparent phosphor and then the two optical coupling layers are placed in contact with one another. In preferred embodiments, the optical coupling layer may be cured at an elevated temperature between about 30 degrees Celsius and about 200 degrees Celsius, between about 80 degrees Celsius and about 160 degrees Celsius, or between about 120 degrees Celsius and about 150 degrees Celsius, for a duration between about 1 minute and about 1000 minutes. In alternate embodiments, the optical coupling layer may be subjected to a multi-step cure process at multiple elevated temperatures. A controlled ambient environment may be applied during the cure step. In some embodiments, the bonding surfaces may be subjected to a cleaning step using a solvent, a dilute acid or base, an oxygen plasma or a UV ozone treatment, prior to the application of the optical coupling layer. In some embodiments, a transparent phosphor may be attached at least one surface of an LED device using a manual attach process, using a semi-automated attach process, or a fully automated attach process. One or more fiducials or other distinguishing markings or features may be provided on the LED surface, on the substrate to which the LED is attached, or on the package in which the LED is placed, in order to enable appropriate alignment of the transparent phosphor to the LED. In an alternative embodiment, the transparent phosphor may be attached to at least one surface of the LED without the aid of an optical coupling layer. This may be achieved using a method such as wafer fusion.

In some embodiments, the lateral dimensions of the transparent phosphor may be smaller than those of the LED to which it is attached. In a alternative embodiment, the lateral dimensions of the transparent phosphor may be exactly equal to those of the LED to which it is attached. In a preferred embodiment, the lateral dimensions of the transparent phosphor may be slightly larger than those of the LED to which it is attached. In an alternative preferred embodiment, the lateral dimensions of the transparent phosphor may be significantly larger than those of the LED to which it is attached. In specific embodiments, the ratio of the lateral dimensions of the transparent phosphor and the LED to which it is attached may be 1.1, 1.2, 1.3, 1.4 or 1.5. In other embodiments, the ratio of the lateral dimensions of the transparent phosphor and the LED to which it is attached may be greater than 1.5.

Figure 31:
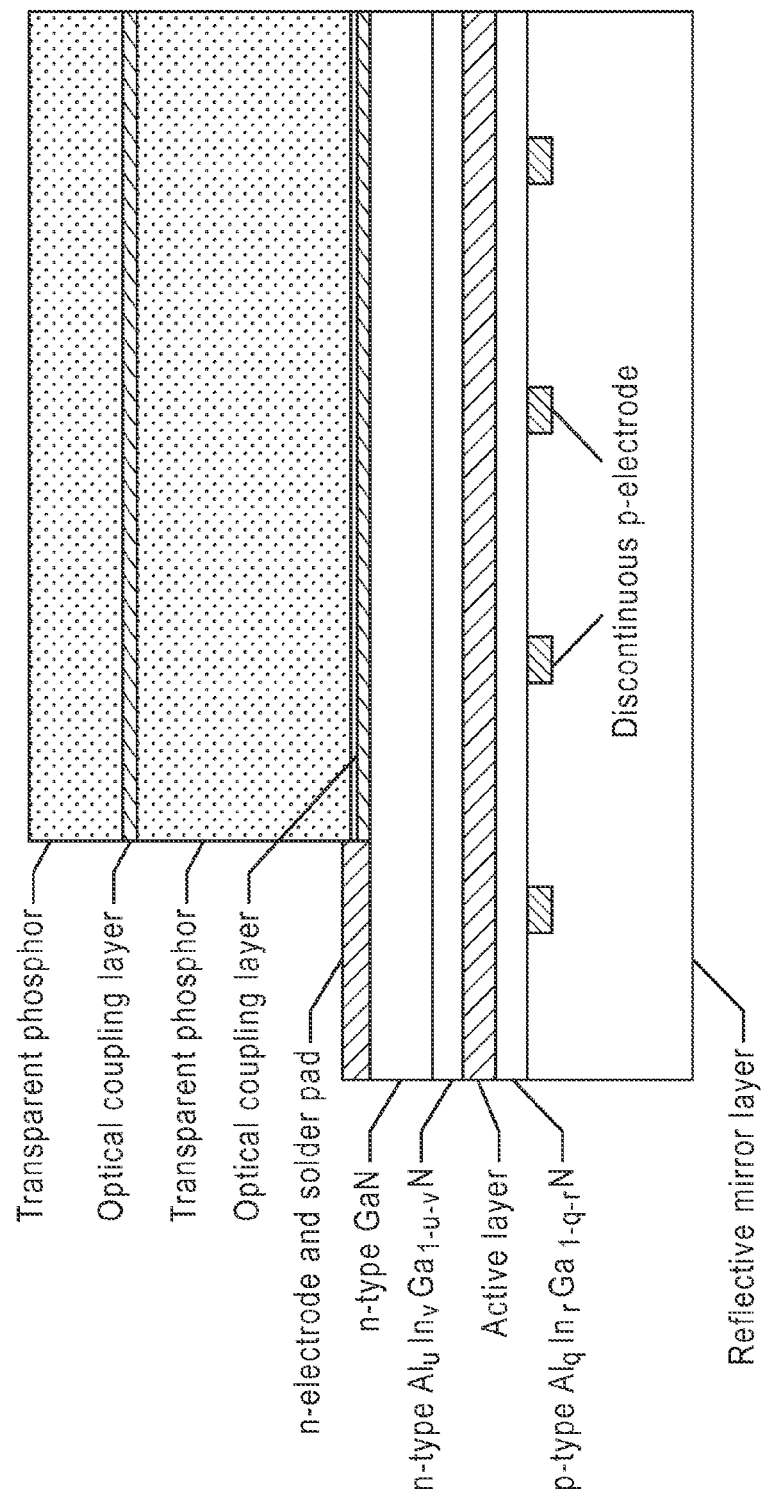
FIG. 31 is a simplified diagram of still another alternative packaged light emitting device having multiple transparent phosphor entities according to an embodiment of the present invention.

In some embodiments, as shown schematically in FIG. 31, two or more transparent phosphor entities may be optically coupled to a single light emitting device. An optical coupling layer may be provided between a first transparent phosphor and a second transparent phosphor. Additional optical coupling layers may be provided for third, fourth, fifth, or more transparent phosphor entities.

Figure 2:
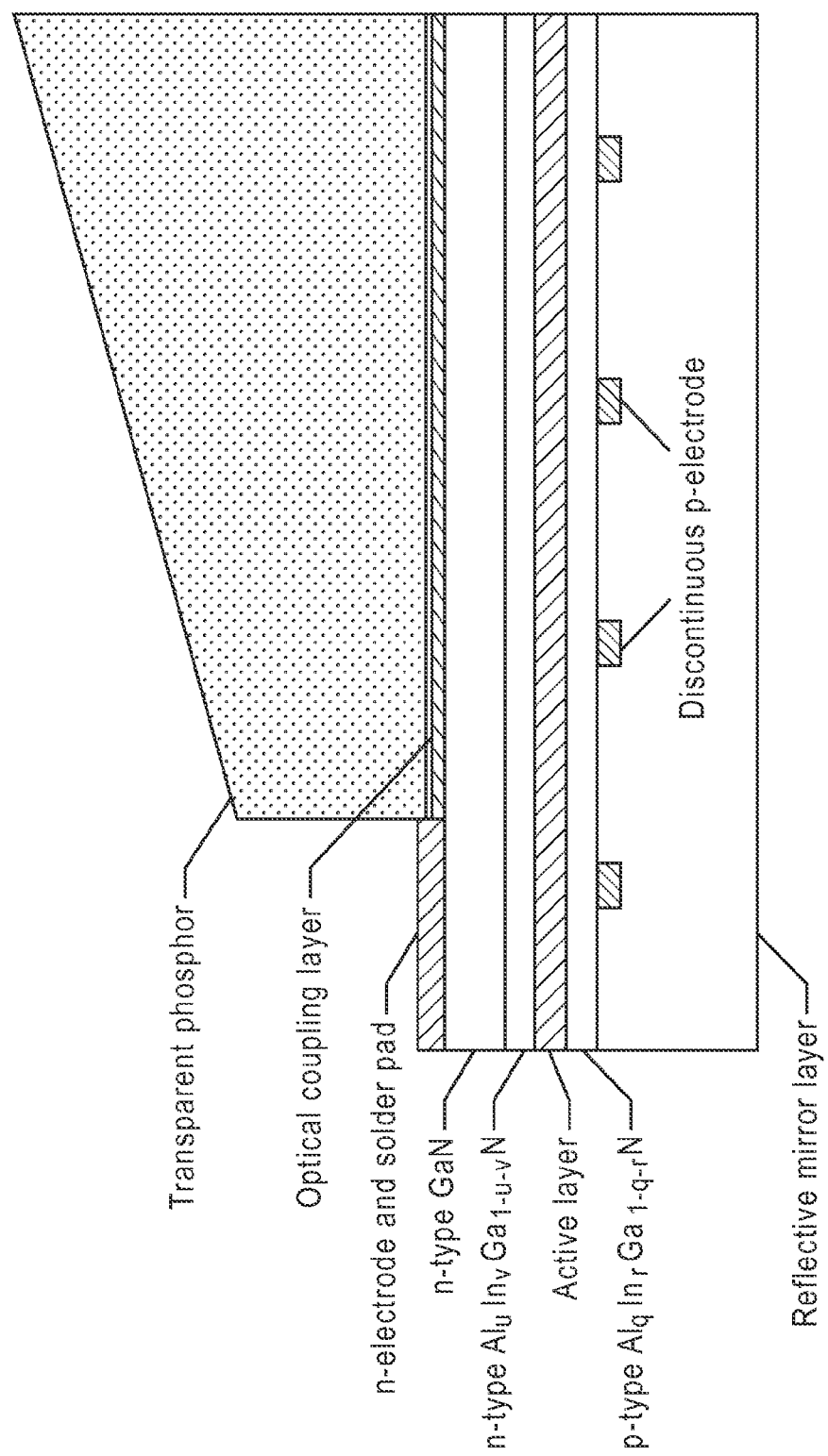
FIG. 2 is a simplified diagram of a light emitting diode coupled to a transparent phosphor according to another embodiment of the present invention.
Figure 3:
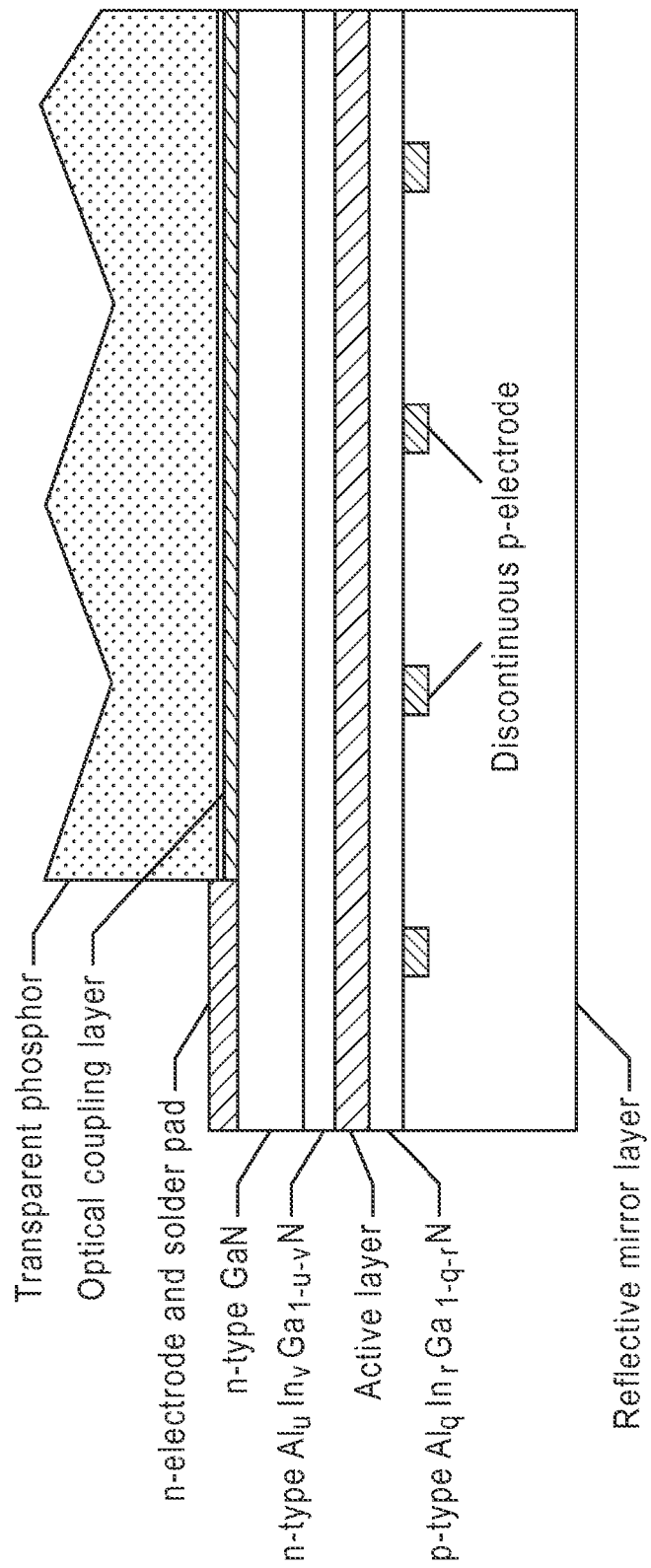
FIG. 3 is a simplified diagram of a light emitting diode coupled to a transparent phosphor according to still another embodiment of the present invention.
Figure 4:
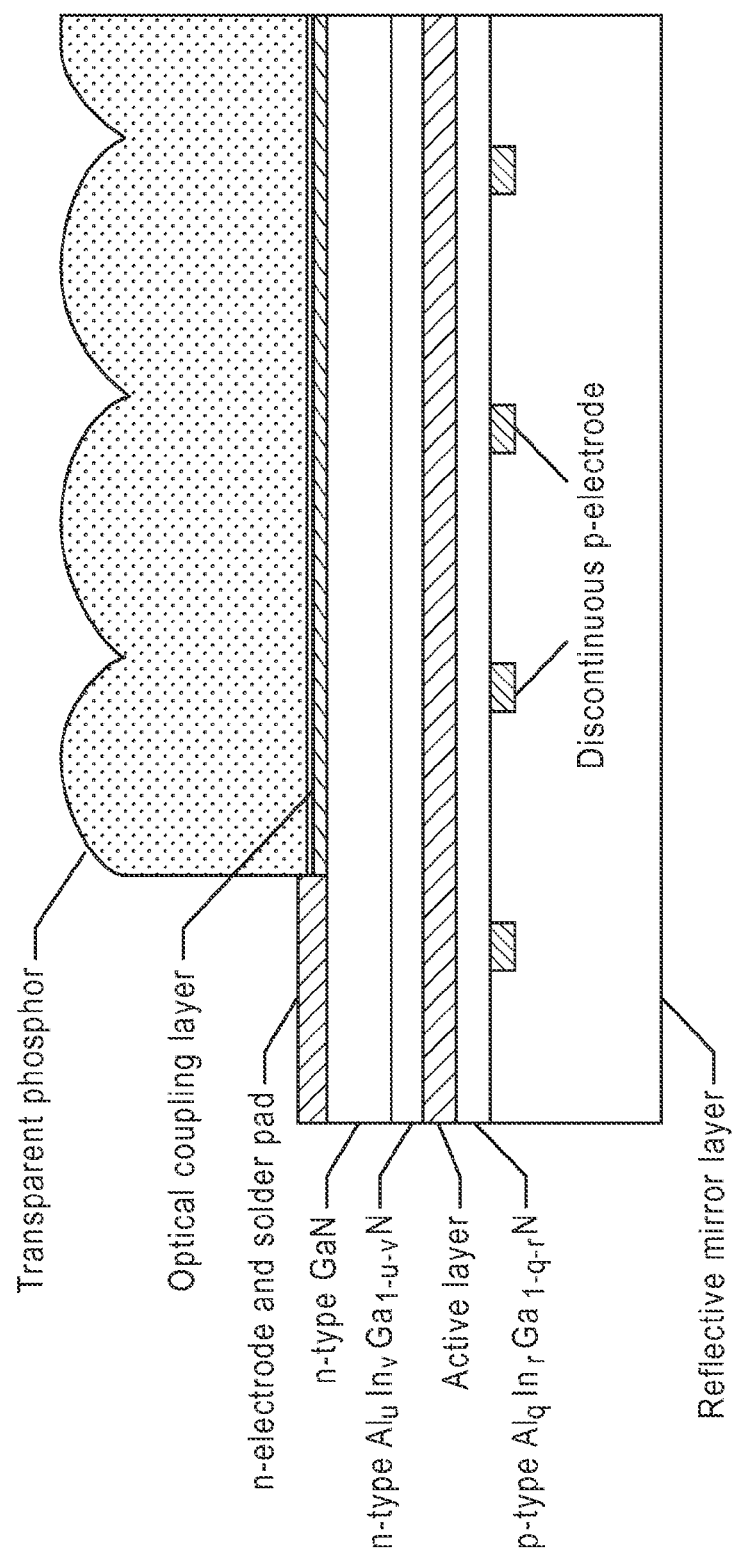
FIG. 4 is a simplified diagram of a light emitting diode coupled to a transparent phosphor according to yet another embodiment of the present invention.
Figure 5:
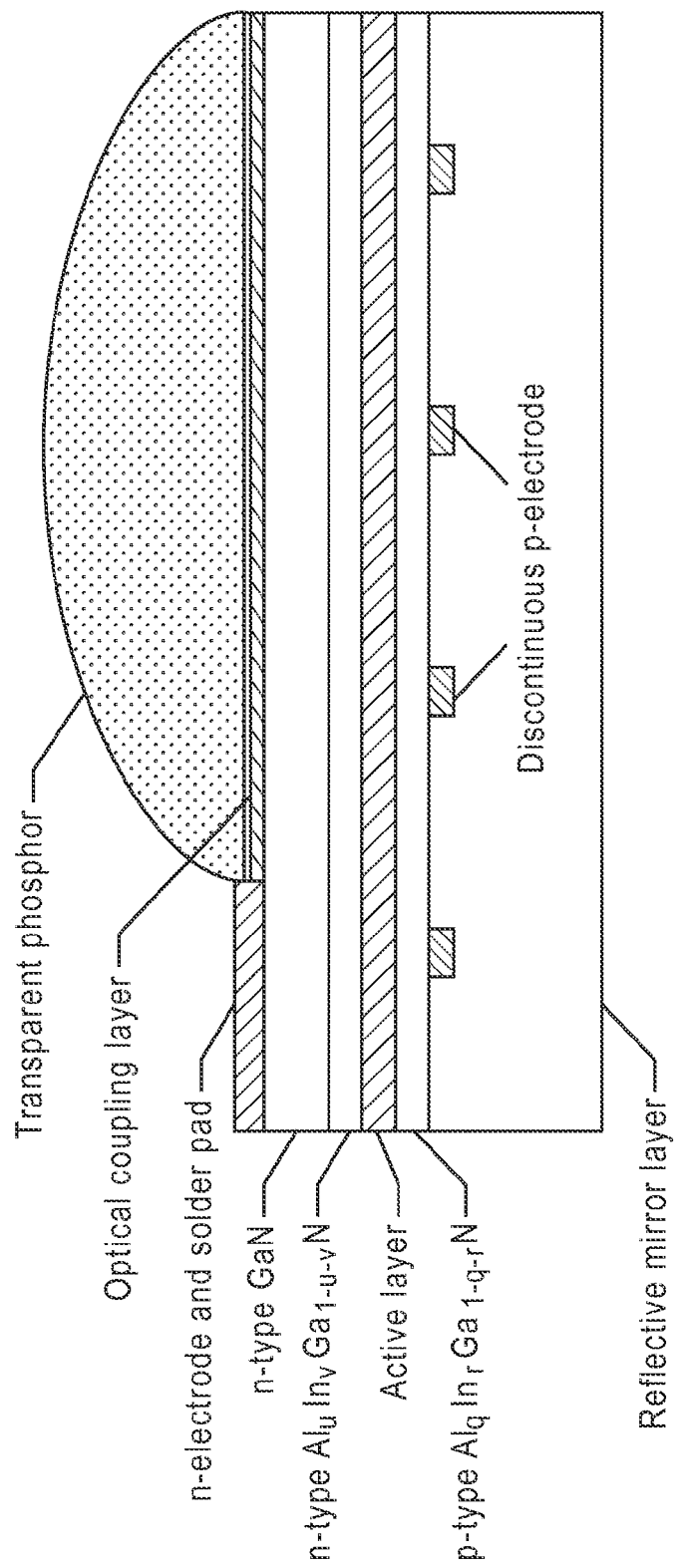
FIG. 5 is a simplified diagram of a light emitting diode coupled to a transparent phosphor according to still another embodiment of the present invention.

In some embodiments, as shown in FIG. 1, the surface of the transparent phosphor opposite the LED is substantially parallel to the surface of the LED. In other embodiments, as shown in FIG. 2, the surface of the transparent phosphor opposite the LED is oriented with a significant wedge angle with respect to the surface of the LED. In a preferred embodiment, the surface of the transparent phosphor opposite the LED is oriented with an angle with respect to the surface of the LED that is approximately equal to the Brewster angle for light emerging from the transparent phosphor into air or into the encapsulant material overlying the transparent phosphor. In some embodiments, the refractive index of the transparent phosphor is chosen to be equal to or substantially equal to the square root of the product of the refractive index of the gallium nitride substrate or at least one AlInGaN layer provided on the gallium nitride substrate, and the refractive index of air or encapsulant material overlying the transparent phosphor. In an alternative embodiment, the surface of the transparent phosphor opposite the LED is oriented with an angle with respect to the surface of the LED that is smaller than the angle of total internal reflection for the interface between the transparent phosphor and air or encapsulant material overlying the transparent phosphor. In still other embodiments, as shown in FIG. 3, the surface of the transparent phosphor opposite the LED has a sawtooth or other similar one-dimensional grating pattern. In a preferred embodiment, the wedge angle of each sawtooth pattern is approximately equal to the Brewster angle for the light emerging from the transparent phosphor into air or into the encapsulant material overlying the transparent phosphor. In an alternative embodiment, the wedge angle of each sawtooth pattern is less than the angle of total internal reflection for the interface between the transparent phosphor and air or encapsulant material overlying the transparent phosphor. In some embodiments the lateral period (unit cell) of the sawtooth pattern is between 1 nm and 1000 nm. In a preferred embodiment, the lateral period of the sawtooth pattern is between about 1 micron and about 100 microns. In another preferred embodiment, the lateral period of the sawtooth pattern is between about 100 microns and about 1000 microns. In yet other embodiments, as shown in FIG. 4, the surface of the transparent phosphor opposite the LED has a microlens pattern. The shape of the individual microlenses pattern may be designed using a numerical simulation, ray-tracing or similar method, in order to maximize the extraction of light from the transparent phosphor and LED. In still other embodiments, as shown in FIG. 5, the surface of the transparent phosphor opposite the LED forms a dome. The shape of the dome may be designed using a numerical simulation, ray-tracing or similar method, in order to maximize the extraction of light and/or the polarization of the light emitted from the transparent phosphor and LED. In a preferred embodiment, the wedge, sawtooth pattern, microlens pattern or dome is formed during the fabrication of the transparent phosphor using a mold. In an alternative embodiment, the wedge may be formed using a lapping and polishing step following the fabrication of the transparent phosphor. In yet another alternative embodiment, the sawtooth pattern, microlens pattern or dome may be formed using a lithography step followed by a dry-etch or wet-etch process, following the fabrication of the transparent phosphor.

Figure 32:
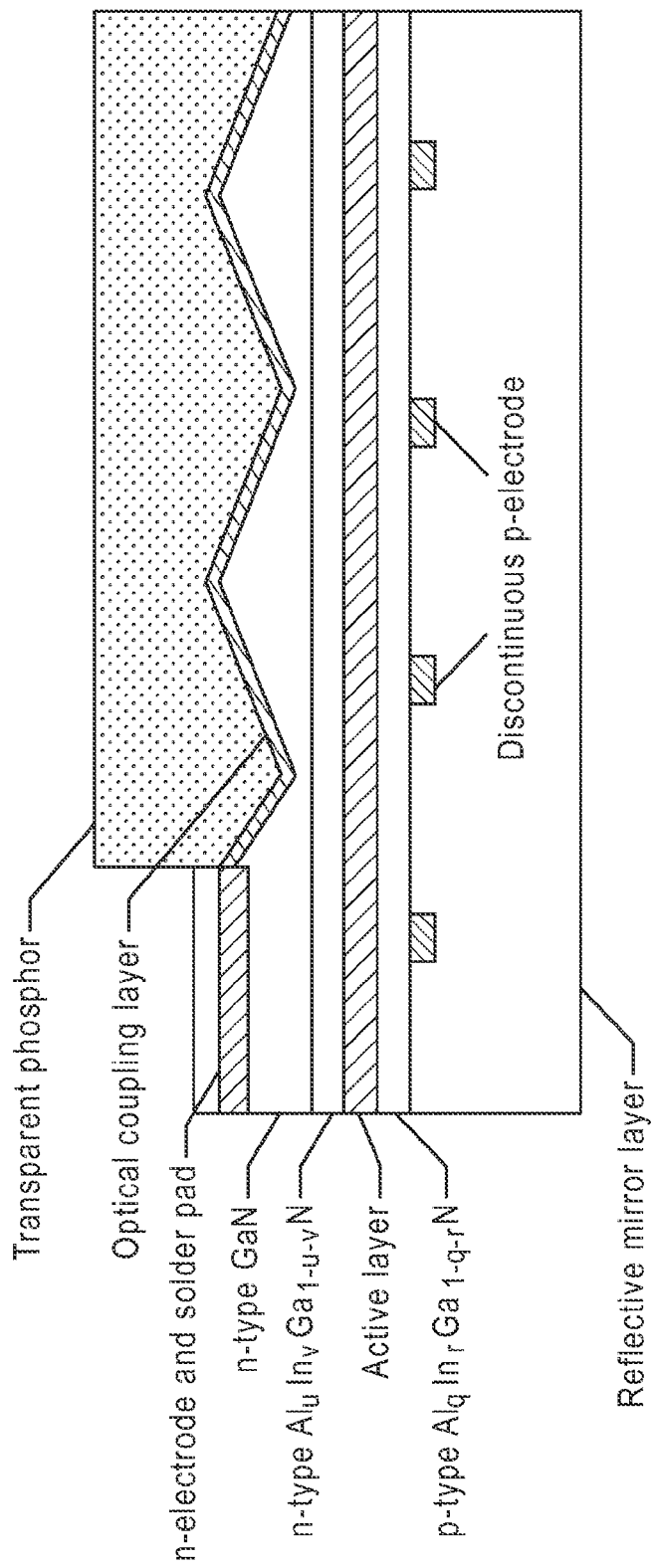
FIG. 32 is a simplified diagram of yet an alternative light emitting diode device having a patterned or textured surface region according to an embodiment of the present invention.

In some embodiments, as shown schematically in FIG. 32, at least one surface of a light emitting device is patterned or textured. In one specific embodiment, the surface of the light emitting device facing the transparent phosphor entity is patterned with a sawtooth pattern. The surface of the transparent phosphor entity facing the light emitting device may have a similar sawtooth pattern, so that the surfaces may be positioned in close proximity to one another, with an optical coupling layer between them. The surface of the transparent phosphor opposite the LED may be planar or may comprise a wedge, a sawtooth pattern, a microlens, or a dome. The shapes of the outward facing surface of the LED and of the inward and outward facing surfaces of one or more transparent phosphor entities optically coupled to the LED may be designed using a numerical simulation, ray-tracing or similar method, in order to maximize the extraction of light and/or the polarization of the light emitted from the transparent phosphor and LED.

FIG. 6 is a simplified diagram of a packaged light emitting device 600 using a recessed configuration according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 600. As shown, the device has a substrate member comprising a surface region. In a specific embodiment, the substrate is made of a suitable material such a metal including, but not limited to, Alloy 42, copper, and others, among plastics, dielectrics, epoxies and the like. In a specific embodiment, the substrate is generally from a lead frame member such as metal alloy, but can be others. In a specific embodiment, the substrate is made of a ceramic material such as alumina or aluminum nitride. Other ceramic materials may also be used as substrates. In a specific embodiment, the substrate may be comprised of a hybrid between a metal and a second material. In a specific embodiment, the substrate may be comprised of a hybrid between a metal and a second and third material. The second and third materials may be comprised of one or more metal, ceramic, plastic, dielectric or epoxy material and the like. In yet another specific embodiment, the substrate may have a multi-layer structure, wherein the individual layers may be comprised of one or more metals or ceramic, plastic, dielectric and epoxy materials.

In a specific embodiment, the present substrate, which holds the LED, can come in various shapes, sizes, and configurations. In a specific embodiment, the surface region of substrate 101 is cupped. Alternatively, the surface region 601 is recessed according to a specific embodiment. Additionally, the surface region generally comprises a smooth surface, plating, or coating. Such plating or coating can be gold, silver, platinum, aluminum, or any pure or alloy or multi-layer material, which is suitable for bonding to an overlying semiconductor material, but can be others. Of course, there can be other variations, modifications, and alternatives.

Referring again to FIG. 6, the device has at least one light emitting diode device overlying the surface region. At least one of the light emitting diode devices 603 is fabricated on a semipolar or nonpolar GaN containing substrate. In a specific embodiment, the device emits polarized electromagnetic radiation 605. As shown, the light emitting device is coupled to a first potential, which is attached to the substrate, and a second potential 609, which is coupled to wire or lead 611 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the at least one light emitting diode device comprises a blue LED device. In a specific embodiment, the substantially polarized emission is blue light. The at least one light emitting diode device comprises a blue LED device capable of emitting electromagnetic radiation at a range from about 430 nanometers to about 490 nanometers, which is substantially polarized emission being blue light. In a specific embodiment, a {1 −1 0 0} m-plane bulk substrate is provided for the nonpolar blue LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 8 nm of InGaN and 37.5 nm of GaN as the barrier layers. Next, a 10 nm undoped AlGaN electron blocking layer is deposited. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about 300×300 μm$^2$, are formed by photolithography and dry etching using a chlorine-based inductively-coupled plasma (ICP) technique. Ti/Al/Ni/Au is e-beam evaporated onto the exposed n-GaN layer to form the n-type contact, Ti/Au is e-beam evaporated onto a portion of the ITO layer to form a p-contact pad, and the wafer is diced into discrete LED dies. Electrical contacts are formed by conventional wire bonding. Of course, there can be other variations, modifications, and alternatives.

In a specific embodiment, the present device also has a thickness of one or more entities comprising a transparent phosphor overlying the at least one light emitting diode device. In a specific embodiment, the one or more entities are excited by the substantially polarized emission and emit substantially polarized electromagnetic radiation of one or more second wavelengths. In a preferred embodiment, the plurality of entities is capable of emitting substantially polarized yellow light from an interaction with the substantially polarized emission of blue light. In a specific embodiment, the thickness of the plurality of entities, which are phosphor entities, is less than about 1 millimeter, less than about 0.3 millimeter, less than about 0.1 millimeter, or less than about 10 micrometers. Of course, there can be other variations, modifications, and alternatives.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$. In other embodiments, the device may include a phosphor capable of emitting substantially red light. Such phosphor may be selected from one or more of $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and Eu$^{3+}$ activated phosphate or borate phosphors; and mixtures thereof.

In one specific embodiment, the phosphor comprises $R_{3-x-y-z+w2}M_zA_{1.5x+y-w2}Si_{6-w1-w2}Al_{w1+w2}O_{y+w1}N_{11-y-w1}$, where R represents La, Gd, Lu, Y and/or Sc; M represents Ce, Eu, Mn, Yb, Pr and/or Tb; A represents Ba, Sr, Ca, Mg and/or Zn; and x, y, z, w1 and w2 each represents a number satisfying the following relations: $(1/7) \leq (3-x-y-z+w2)/6 < (1/2)$, $0 < (1.5x+y-w2)/6 < (9/2)$, $0 < x < 3$, $0 \leq y < 2$, $0 < z < 1$, $0 \leq w1 \leq 5$, $0 \leq w2 \leq 5$, and $0 \leq w1+w2 \leq 5$. In another embodiment, the phosphor comprises $Sr_{10-x-y-z}M_xEu_yMn_z)(PO_4)_6(Cl_{1-a}Q_a)_2$, where M represents at least one element selected from the group consisting of Ba, Ca, Mg and Zn; Q represents at least one element selected from the group consisting of F, Br and I; and x, y, z and a satisfy the following relations: $0 \leq x \leq 10$, $0.3 \leq y \leq 1.5$, $0 \leq z \leq 3$, $0 \leq a \leq 1$ and $x+y+z \leq 10$. In other embodiments, the phosphor comprises $M^1_xBa_yM^2_zL_uO_vN_w$ (In the formula, $M^1$ represents at least one activator element selected from the group consisting of Mn, Ce, Pr, Nd, Sm, Eu, Tb, Dy, Ho, Er, Tm and Yb; $M^2$ represents at least one divalent metal element selected from the group consisting of Sr, Ca, Mg and Zn; L represents a metal element selected from group 4 or group 14 metal elements of the periodic table; and $0.00001 \leq x \leq 3$, $0 \leq y \leq 2.99999$, $2.6 < x+y+z < 3$, $0 < u \leq 11$, $6 < v \leq 25$, and $0 < w \leq 17$. Of course, there can be other variations, modifications, and alternatives.

In a specific embodiment, the at least one light emitting diode device comprises at least a violet LED device capable of emitting electromagnetic radiation at a range from about 380 nanometers to about 440 nanometers and the one or more entities are capable of emitting substantially white light, the substantially polarized emission being violet light. In a specific embodiment, a (1 –1 0 0) m-plane bulk substrate is provided for the nonpolar violet LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 16 nm of InGaN and 18 nm of GaN as the barrier layers. Next, a 10 nm undoped AlGaN electron blocking layer is deposited. Finally, a p-type GaN contact layer is deposited, with a thickness of about 160 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about 300×300 μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

Other colored LEDs may also be used or combined according to a specific embodiment. Of course, there can be other variations, modifications, and alternatives.

In a specific embodiment, a (1 1 –2 2} bulk substrate is provided for a semipolar green LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 1 micron and a doping level of about $2 \times 10^{18}$ cm$^{-3}$. Next, an InGaN/GaN multiple quantum well (MQW) is deposited as the active layer. The MQW superlattice has six periods, comprising alternating layers of 4 nm of InGaN and 20 nm of Si-doped GaN as the barrier layers and ending with an undoped 16 nm GaN barrier layer and a 10 nm undoped $Al_{0.15}Ga_{0.85}N$ electron blocking layer. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about 200×550 μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In another specific embodiment, a (1 1 –2 2} bulk substrate is provided for a semipolar yellow LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 2 microns and a doping level of about $2 \times 10^{18}$ cm$^{-3}$. Next, a single quantum well (SQW) is deposited as the active layer. The SQW comprises a 3.5 nm InGaN layer and is terminated by an undoped 16 nm GaN barrier layer and a 7 nm undoped $Al_{0.15}Ga_{0.85}N$ electron blocking layer. Finally, a Mg-doped p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about 600×450 μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In a specific embodiment, the one or more entities comprise a blend of phosphors capable of emitting substantially blue light, substantially green light, and substantially red light. As an example, the blue emitting phosphor may be selected from the group consisting of $(Ba,Sr,Ca)_5(PO_4)_3(Cl, F,Br,OH):Eu^{2+},Mn^{2+}$; $Sb^{3+},(Ba,Sr,Ca)MgAl_{10}O_{17}:Eu^{2+}, Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+};$ $Sr_2Si_3O_8*2SrCl_2:Eu^{2+}$; $(Ba,Sr,Ca)Mg_xP_2O_7:Eu^{2+},Mn^{2+}$; $Sr_4Al_{14}O_{25}:Eu^{2+}$ (SAE); $BaAl_8O_{13}:Eu^{2+}$; and mixtures thereof. As an example, the green phosphor may be selected from the group consisting of $(Ba,Sr,Ca)MgAl_{10}O_{17}:Eu^{2+}, Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al, Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4C_{12}:Eu^{2+},Mn^{2+}$ (CASI); $Na_2Gd_2B_2O_7:Ce^{3+},Tb^{3+}$; $(Ba,Sr)_2(Ca,Mg,Zn)B_2O_6:K,Ce, Tb$; and mixtures thereof. As an example, the red phosphor may be selected from the group consisting of $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4:$, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes an enclosure 617. The enclosure can be made of a suitable material such as an optically transparent plastic, glass, epoxy, silicone or other material. As also shown, the enclosure has a suitable shape according to a specific embodiment. The shape can be annular, circular, egg-shaped, trapezoidal, or any combination of these shapes. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

FIGS. 7 through 10 illustrate a simplified method of assembling the light emitting device of FIG. 6 according to an embodiment of the present invention. These diagrams are merely illustrations and should not unduly limit the scope of the claims herein. One of ordinary skill in the art would recognize other variations, modifications, and alternatives. Also shown is a method for assembling an LED device according to an embodiment of the present invention. The method includes providing a substrate member 601 comprising a surface region. In a specific embodiment, the substrate is made of a suitable material such a metal including, but not limited to, Alloy 42, copper, dielectrics, plastics, or others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 601 is cupped. Alternatively, the surface region of substrate 601 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

In a specific embodiment, the method includes providing at least one light emitting diode device overlying the surface region. At least one of the light emitting diode devices 603 is fabricated on a semipolar or nonpolar GaN containing substrate. In a specific embodiment, the device emits polarized electromagnetic radiation 605. As shown, the light emitting device is coupled to a first potential, which is attached to the substrate, and a second potential 609, which is coupled to wire or lead 611 bonded to a light emitting diode. Of course, there can be other variations, modifications, and alternatives.

In a preferred embodiment, the at least one light emitting diode device comprises a blue LED device. In a specific embodiment, the substantially polarized emission is blue light. The at least one light emitting diode device comprises a blue LED device capable of emitting electromagnetic radiation at a range from about 430 nanometers to about 490 nanometers, which is substantially polarized emission being blue light.

In a specific embodiment, the LED device is attached onto the surface region of the substrate. The attachment occurs by silver paste, solder paste (SAC305), eutectic, AuSn eutectic, or other suitable techniques. In a preferred embodiment, the LED device is attached using die attach methods such as eutectic bonding of metals such as gold, silver, tin, copper or platinum, or alloys thereof, among others. Of course, there can be other variations, modifications, and alternatives.

Referring now to FIG. 8, the present method includes bonding wiring 115 from lead 109 to a bonding pad on the LED device. In a specific embodiment, the wire is a suitable material such as gold, aluminum, or others. In a specific embodiment, wire bonding uses techniques such as ultrasonic, megasonic, or others. Of course, there can be other variations, modifications, and alternatives.

Referring now to FIG. 9, the method includes providing a thickness 115 of one or more entities comprising a transparent phosphor overlying the at least one light emitting diode device. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is less than about 1 millimeter, less than about 0.3 millimeter, less than about 0.1 millimeter, or less than about 10 micrometers. Of course, there can be other variations, modifications, and alternatives.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$. In other embodiments, the device may include a phosphor capable of emitting substantially red light. Such phosphor may be selected from $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}SiO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more entities comprise a blend of phosphors capable of emitting substantially blue light, substantially green light, and substantially red light. As an example, the blue emitting phosphor may be selected from the group consisting of $(Ba,Sr,Ca)_5(PO_4)_3(Cl,F,Br,OH):Eu^{2+},Mn^{2+}$; $Sb^{3+},(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+},Mn^{2+}$; $Sr_4Al_{14}O_{25}:Eu^{2+}$ (SAE); $BaAl_8O_{13}:Eu^{2+}$; and mixtures thereof. As an example, the green phosphor may be selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4C_{12}:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4C_{12}:Eu^{2+},Mn^{2+}$ (CASI); $Na_2Gd_2B_2O_7:Ce^{3+},Tb^{3+}$; $(Ba,Sr)_2(Ca,Mg,Zn)B_2O_6:K,Ce,Tb$; and mixtures thereof. As an example, the red phosphor may be selected from the group consisting of $(Gd,Y,Lu,La)_2O_3:Eu^{3+}, Bi^{3+}$; $(Gd,Y,Lu,La)_2O_2S:Eu^{3+},Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$:, where $0.05 \le x \le 0.5$, $0 \le y \le 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 \le x \le 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \le x. \le 1.0$, $0.01 \le y \le 1.0$; $(SrCa)_{1-x}Eu_xSi_5N_8$, where $0.01 \le x \le 0.3$; $SrZnO_2:Sm^{+3}$; $M_mO_nX$, wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^{3+}$ activated phosphate or borate phosphors; and mixtures thereof.

In a specific embodiment, the present method includes providing an enclosure 117 overlying the LED device, which has been mounted, bonded, and coated. The enclosure can be made of a suitable material such as an optically transparent plastic, epoxy, silicone, glass, or other material. As also shown, the enclosure has a suitable shape 119 according to a specific embodiment. The shape can be annular, circular, egg-shaped, trapezoidal, or any combination of these shapes. The shape may be formed by molding. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

FIG. 11 is a simplified diagram of an alternative packaged light emitting device 1100 using multiple devices according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 1100. As shown, the device has a substrate member comprising a surface region. In a specific embodiment, the substrate is made of a suitable material such a metal including, but not limited to, Alloy 42, copper, or others, including dielectrics and even plastics. In a specific embodiment, the substrate is generally from a lead frame member such as metal alloy, but can be others.

In a specific embodiment, the present substrate, which holds the LED, can come in various shapes, sizes, and configurations. In a specific embodiment, the surface region of substrate 1101 is cupped. Alternatively, the surface region 1101 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

Referring again to FIG. 11, the device has at least one light emitting diode device overlying the surface region. At least one of the light emitting diode devices 1103 is fabricated on a semipolar or nonpolar GaN containing substrate. In a specific embodiment, the device emits polarized electromagnetic radiation. As shown, the light emitting device is coupled to a first potential, which is attached to the substrate, and a second potential 1109, which is coupled to wire or lead 1111 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the at least one light emitting diode device comprises a blue LED device. In a specific embodiment, the substantially polarized emission is blue light. The at least one light emitting diode device comprises a blue LED device capable of emitting electromagnetic radiation at a range from about 430 nanometers to about 490 nanometers, which is substantially polarized emission being blue light.

In a specific embodiment, the present device also has a thickness 1115 of one or more entities comprising a transparent phosphor overlying the at least one light emitting diode device. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is less than about 1 millimeter, less than about 0.3 millimeter, less than about 0.1 millimeter, or less than about 10 micrometers. Of course, there can be other variations, modifications, and alternatives.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$. In other embodiments, the device may include a phosphor capable of emitting substantially red light. Such phosphor is be selected from $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \le x \le 0.5$, $0 \le y \le 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn_4+$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 < x \le 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \le x. \le 1.0$, $0.01 \le y \le 1.0$; $(SrCa)_{1-x}Eu_xSi_5N_8$, where $0.01 \le x \le 0.3$; $SrZnO_2:Sm^{+3}$; $M_mO_nX$ wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the at least one light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH)$:$Eu^{2+},Mn^{2+}$; $Sb^{3+}$,$(Ba,Sr,Ca)MgAl_{10}O_{17}$:$Eu^{2+},Mn^{2+}$; $(Ba,Sr,Ca)BPO_5$:$Eu^{2+},Mn^{2+}$; $(Sr,Ca)_{10}(PO_4)_6*nB_2O_3$:$Eu^{2+}$; $2SrO*0.84P_2O_5*0.16B_2O_3$:$Eu^{2+}$; $Sr_2Si_3O_8*2SrCl_2$:$Eu^{2+}$; $(Ba,Sr,Ca)Mg_xP_2O_7$:$Eu^{2+},Mn^{2+}$; $Sr_4Al_{14}O_{25}$:$Eu^{2+}$ (SAE); $BaAl_8O_{13}$:$Eu^{2+}$; and mixtures thereof. As an example, the green phosphor is selected from the group consisting of $(Ba,Sr,Ca)MgAl_{10}O_{17}$:$Eu^{2+},Mn^{2+}$ (BAMn); $(Ba,Sr,Ca)Al_2O_4$:$Eu^{2+}$; $(Y,Gd,Lu,Sc,La)BO_3$:$Ce^{3+},Tb^{3+}$; $Ca_8Mg(SiO_4)_4C_{12}$:$Eu^{2+},Mn^{2+}$; $(Ba,Sr,Ca)_2SiO_4$:$Eu^{2+}$; $(Ba,Sr,Ca)_2(Mg,Zn)Si_2O_7$:$Eu^{2+}$; $(Sr,Ca,Ba)(Al,Ga,In)_2S_4$:$Eu^{2+}$; $(Y,Gd,Tb,La,Sm,Pr,Lu)_3(Al,Ga)_5O_{12}$:$Ce^{3+}$; $(Ca,Sr)_8(Mg,Zn)(SiO_4)_4Cl_2$:$Eu^{2+},Mn^{2+}$ (CASI); $Na_2Gd_2B_2O_7$:$Ce^{3+},Tb^{3+}$; $(Ba,Sr)_2(Ca,Mg,Zn)B_2O_6$:K,Ce,Tb; and mixtures thereof. As an example, the red phosphor is selected from the group consisting of $(Gd,Y,Lu,La)_2O_3$:$Eu^{3+},Bi^{3+}$; $(Gd,Y,Lu,La)_2O_2S$:$Eu^{3+},Bi^{3+}$; $(Gd,Y,Lu,La)VO_4$:$Eu^{3+},Bi^{3+}$; $Y_2(O,S)_3$:$Eu^{3+}$; $Ca_{1-x}Mo_{1-y}Si_yO_4$:, where $0.05\le x\le 0.5$, $0\le y\le 0.1$; $(Li,Na,K)_5Eu(W,Mo)O_4$; $(Ca,Sr)S$:$Eu^{2+}$; $SrY_2S_4$:$Eu^{2+}$; $CaLa_2S_4$:$Ce^{3+}$; $(Ca,Sr)S$:$Eu^{2+}$; $3.5MgO*0.5MgF_2*GeO_2$:$Mn^{4+}$ (MFG); $(Ba,Sr,Ca)Mg_xP_2O_7$:$Eu^{2+},Mn^{2+}$; $(Y,Lu)_2WO_6$:$Eu^{3+}$, $Mo^{6+}$; $(Ba,Sr,Ca)_3Mg_xSi_2O_8$:$Eu^{2+}$, $Mn^{2+}$, wherein $1\le x\le 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5\le x.\le 1.0$, $0.01\le y\le 1.0$; $(SrCa)_{1-x}Eu_xSi_5N_8$, where $0.01\le x\le 0.3$; $SrZnO_2$:$Sm^{+3}$; $M_mO_nX$, wherein M is selected from the group of Sc, Y, a lanthanide, an alkali earth metal and mixtures thereof; X is a halogen; $1\le m\le 3$; and $1\le n\le 4$, and wherein the lanthanide doping level can range from 0.1 to 40% spectral weight; and $Eu^{3+}$ activated phosphate or borate phosphors; and mixtures thereof.

In a specific embodiment, the present packaged device includes a second LED device or possibly multiple devices. In a specific embodiment, the second LED device can be covered by a transparent a phosphor or uncovered. In a specific embodiment, the LED device can be one of a plurality of colors including, but not limited to red, blue, green, yellow, violet, amber, cyan, and others within a visible electromagnetic radiation range, including ultraviolet. In a specific embodiment, the LED device can be made on a polar, nonpolar, or semi-polar gallium nitride containing material. Alternatively, the LED can be made on a GaP, AlInGaP or like material according to other embodiments. Of course, there can be other variations, modifications, and alternatives.

In other embodiments, the packaged device can include one or more other types of optical and/or electronic devices. As an example, the optical devices can be an organic light emitting diode (OLED), a laser diode, a nanoparticle optical device, or others. In other embodiments, the electronic device can include an integrated circuit, a sensor, a Micro- or Nano-Electro-Mechanical System, or any combination of these, and the like. Of course, there can be other variations, modifications, and alternatives.

In a specific embodiment, the present packaged device includes an enclosure 1117. The enclosure can be made of a suitable material such as an optically transparent plastic, glass, or other material. As also shown, the enclosure has a suitable shape 1119 according to a specific embodiment. The shape can be annular, circular, egg-shaped, trapezoidal, or any combination of these. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

FIGS. 12 through 15 illustrate a simplified method of assembling the light emitting device of FIG. 6 according to an embodiment of the present invention. Of course, there can be other variations, modifications, and alternatives.

FIG. 16 is a simplified diagram of yet another alternative packaged light emitting device using an optical path to a plane region according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 1600. As shown, the device has a substrate member comprising a surface region. In a specific embodiment, the substrate is made of a suitable material such a metal including, but not limited to, Alloy 42, copper, dielectrics or plastics, among others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 1601 is cupped. Alternatively, the surface region 1601 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

Referring again to FIG. 16, the device has at least one light emitting diode device overlying the surface region. At least one of the light emitting diode devices 1603 is fabricated on a semipolar or nonpolar GaN containing substrate. In a specific embodiment, the device emits substantially polarized electromagnetic radiation 1605. As shown, the light emitting device is coupled to a first potential, which is attached to the substrate, and a second potential 1609, which is coupled to wire or lead 1611 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the at least one light emitting diode device comprises a blue LED device. In a specific embodiment, the substantially polarized emission is blue light. The at least one light emitting diode device comprises a blue LED device capable of emitting electromagnetic radiation at a range from about 430 nanometers to about 490 nanometers, which is substantially polarized emission being blue light.

In a specific embodiment, the present packaged device includes an enclosure 1617. The enclosure can be made of a suitable material such as an optically transparent plastic, glass, or other material. As also shown, the enclosure has a suitable shape 1619 according to a specific embodiment. The shape can be annular, circular, egg-shaped, trapezoidal, or any combination of these. Depending upon the embodiment, the enclosure with suitable shape and material is configured to facilitate and even optimize transmission of electromagnetic radiation from the LED device through the surface region of the enclosure. In a specific embodiment, the enclosure comprises an interior region and an exterior region with a volume defined within the interior region. The volume is open and filled with a fluid, such as epoxy or silicone to provide an optical path between the LED device or devices and the surface region of the enclosure. In a specific embodiment, the enclosure also has a thickness and fits around a base region of the substrate. Of course, there can be other variations, modifications, and alternatives.

In a specific embodiment, the present packaged device also has a thickness 1615 of one or more entities comprising a transparent phosphor overlying the enclosure to interact with light from the at least one light emitting diode device. In a specific embodiment, the one or more entities are excited by the substantially polarized emission and emit substantially polarized electromagnetic radiation of one or more second wavelengths. In a preferred embodiment, the plurality of entities is capable of emitting substantially polarized yellow light from an interaction with the substantially polarized emission of blue light. In a specific embodiment, the thickness of the plurality of entities, which are transparent phosphor entities, is less than about 1 millimeter, less than about 0.3 millimeter, less than about 0.1 millimeter, or less than about 10 micrometers. Of course, there can be other variations, modifications, and alternatives.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$. In other embodiments, the device may include a phosphor capable of emitting substantially red light. Such phosphor may be selected from $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications and alternatives.

In a specific embodiment, the at least one light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+},Mn^{2+}$; $Sb^{3+},(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+},Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+},Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$ (CASI); $Na_2Gd_2B_2O_7:Ce^{3+},Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

FIGS. 17 through 20 illustrate a simplified method of assembling the light emitting device of FIG. 16 according to an embodiment of the present invention. These diagrams are merely an example, which should not unduly limit the scope of the claims herein. One of ordinary skill in the art would recognize other variations, modifications, and alternatives.

FIG. 16 is a simplified diagram of yet another alternative packaged light emitting device 1600 using an optical path to a plane region and filler material according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 1600. As shown, the device has a substrate member comprising a surface region. In a specific embodiment, the substrate is made of a suitable material such a metal including, but not limited to, Alloy 42, copper, dielectric, or even plastic, among others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 1601 is cupped. Alternatively, the surface region of substrate 1601 is recessed according to a specific embodiment. Additionally, the surface region is generally smooth and may be plated or coated. Such plating or coating can be gold, silver, platinum, or any pure or alloy material, which is suitable for bonding to an overlying semiconductor material, but can be others. Of course, there can be other variations, modifications, and alternatives.

Referring again to FIG. 1, the device has at least one light emitting diode device overlying the surface region. Each of the light emitting diode device 1603 is fabricated on a semipolar or nonpolar GaN containing substrate. In a specific embodiment, the device emits polarized electromagnetic radiation 1605. As shown, the light emitting device is coupled to a first potential, which is attached to the substrate, and a second potential 1609, which is coupled to wire or lead 1611 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the at least one light emitting diode device comprises a blue LED device. In a specific embodiment, the substantially polarized emission is blue light. The at least one light emitting diode device comprises a blue LED device capable of emitting electromagnetic radiation at a range from about 480 nanometers to about 570 nanometers, which is substantially polarized emission being blue light.

In a specific embodiment, the present device also has a thickness 1615 of one or more entities comprising a transparent phosphor overlying the at least one light emitting diode device and within an interior region of enclosure 1617, which will be described in more detail below. In a specific embodiment, the one or more entities are excited by the substantially polarized emission and emit substantially polarized electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is less than about 1 millimeter, less than about 0.3 millimeter, less than about 0.1 millimeter, or less than about 10 micrometers. Of course, there can be other variations, modifications, and alternatives.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$. In other embodiments, the device may include a phosphor capable of emitting substantially red light. Such phosphor is be selected from $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}, Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1<x\leq2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the at least one light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+},Mn^{2+};Sb^{3+}$, $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+},Mn^{2+}$; $Sr4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+},Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$ (CASI); $Na_2Gd_2B_2O_7:Ce^{3+},Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4'}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1<x\leq2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes an enclosure 1617. The enclosure can be made of a suitable material such as an optically transparent plastic, glass, or other material. As also shown, the enclosure has a suitable shape 1619 according to a specific embodiment. The shape can be annular, circular, egg-shaped, trapezoidal, or any combination of these shapes. Depending upon the embodiment, the enclosure with suitable shape and material is configured to facilitate and even optimize transmission of electromagnetic radiation from the LED device through the surface region of the enclosure. In a specific embodiment, the enclosure comprises an interior region and an exterior region with a volume defined within the interior region. The volume is open and filled with a fluid, such as epoxy or silicone to provide an optical path between the LED device or devices and the surface region of the enclosure. In a specific embodiment, the enclosure also has a thickness and fits around a base region of the substrate. Of course, there can be other variations, modifications, and alternatives.

FIGS. 17 through 20 illustrate a simplified method of assembling the light emitting device of FIG. 16 according to an embodiment of the present invention.

FIG. 21 is a simplified diagram of a yet an alternative packaged light emitting device using an optical path to a plane region according to an embodiment of the present invention. As shown, the packaged light emitting device includes one or more transparent phosphor entities formed within an interior region of enclosure 2117. As shown, the one or more entities can be deposited within the interior region facing the light emitting diode devices.

FIG. 22 is a simplified diagram of a yet an alternative packaged light emitting device using an optical path to a plane region according to an embodiment of the present invention. As shown, the packaged light emitting device includes one or more transparent phosphor entities formed within of a thickness of or as a portion of enclosure 2617. As shown, the one or more entities can be formed within a thickness and formed within the enclosure according to a specific embodiment.

Although the above has been described in terms of an embodiment of a specific package, there can be many variations, alternatives, and modifications. As an example, the LED device can be configured in a variety of packages such as cylindrical, surface mount, power, lamp, flip-chip, star, array, strip, or geometries that rely on lenses (silicone, glass) or sub-mounts (ceramic, silicon, metal, composite). Alternatively, the package can be any variations of these packages. Of course, there can be other variations, modifications, and alternatives.

In other embodiments, the packaged device can include one or more other types of optical and/or electronic devices. As an example, the optical devices can be OLED, a laser, a nanoparticle optical device, and others. In other embodiments, the electronic device can include an integrated circuit, a sensor, a micro-electro-mechanical system, or any combination of these, and the like. Of course, there can be other variations, modifications, and alternatives.

In a specific embodiment, the packaged device can be coupled to a rectifier to convert alternating current power to direct current, which is suitable for the packaged device. The rectifier can be coupled to a suitable base, such as an Edison screw such as E27 or E14, bipin base such as MR16 or GU5.3, or a bayonet mount such as GU10, or others. In other embodiments, the rectifier can be spatially separated from the packaged device. Of course, there can be other variations, modifications, and alternatives.

Additionally, the present packaged device can be provided in a variety of applications. In a preferred embodiment, the application is general lighting, which includes buildings for offices, housing, outdoor lighting, stadium lighting, and others. Alternatively, the applications can be for display, such as those used for computing applications, televisions, projectors, micro-, nano-, or pico-projectors, flat panels, microdisplays, and others. Still further, the applications can include automotive, gaming, and others. Of course, there can be other variations, modifications, and alternatives.

EXAMPLE 1

To prove the operation and method of the present invention, we performed experiments and provide these examples. These examples are illustrative and should not limit the scope of the claims herein. One of ordinary skill in the art would recognize other variations, modifications, and alternatives. In our example, metallic p-type contacts (Ni/Au/Ti/Au) were formed overlying the p-GaN contact layer of an LED device structure emitting electromagnetic radiation at a nominal wavelength of 450 nm, provided on a bulk non-polar GaN substrate. The LED device structure was generally conventional in design, although other device structures can be used according to other embodiments and/or examples. Next, 300 um×300 um LED mesas were then defined using a $Cl_2$ based reactive ion etch. The backside of the substrate was then polished using a chemical-mechanical polishing process, resulting in an optically flat and transparent back surface. Metallic indium was then deposited in contact with the edge of the substrate as a common n-type electrical contact for the plurality of LED devices. Of course, there can be other variations, modifications, and alternatives.

The substrate was then placed overlying an optically transparent polycrystalline ceramic YAG:Ce (Ce=0.5% by weight) phosphor plate with nominal lateral dimensions of 10 mm×10 mm and a nominal thickness of 0.5 mm in our example. The substrate and the phosphor plate were then placed overlying a circular aperture (diameter ~3 mm) in a sample stage, such as the LED device under test was substantially centered with respect to the aperture. The electromagnetic radiation emitted from the LED device at a first wavelength which is substantially blue was thus used to excite the transparent YAG phosphor and induce the emission of light at a second characteristic wavelength which was substantially yellow, with the combined emission from the LED device and the phosphor being substantially white. A circular polarizing filter was positioned underneath the aperture in the sample stage, using a fixture which enabled the rotation of the polarizing filter about an imaginary optical axis defined by the LED device under test, the center of the aperture of the stage, and the geometrical center of the substantial surface of the polarizing filter. A silicon photodiode was then positioned underneath the polarizing filter, such that a substantial fraction of the electromagnetic radiation that was transmitted through the polarizing filter was incident upon the surface of the silicon photodiode. The photo-current generated in the silicon photodiode as a result of the electromagnetic radiation incident upon it was measured using a Keithley 2600 sourcemeter, but can be other instruments.

Figure 33A:
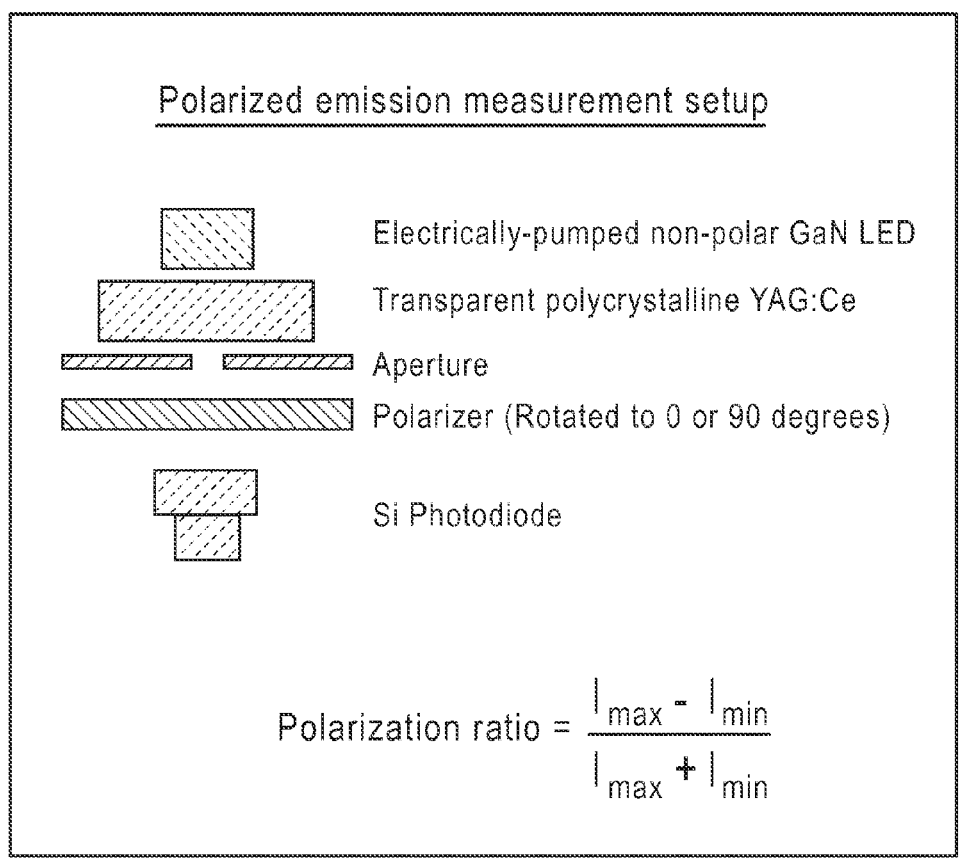
FIG. 33A shows an experimental setup according to certain embodiments.

A pair of micromanipulator probes was used to contact the p-metallization on the LED device under test, and n-metallization on the edge of the substrate containing the LED device under test, and a Keithley 2600 sourcemeter was used to electrically drive the LED. The polarizing filter was aligned to a first position with respect to the LED device under test in a manner such that either one of the two orthogonal emission dipoles (strong and weak) representing the emission from the LED device surface was parallel to the transmission axis of the polarizing filter. Following this alignment, the strength of the emission from the strong and the weak dipole of electromagnetic radiation emitted from the LED device was separated into two components simply by rotation of the polarizing filter by 90 degrees about the optical axis from the first position to a second position. The intensity of light at each of these two positions, represented by the respective values of the photo-current, was measured, and was then used to calculate the polarization ratio for the emission using the well known relationship, polarization ratio=[I(strong)−I(weak)]/[I(strong)+I(weak)]. In this experimental setup, a non-zero value of the polarization ratio indicates that the electromagnetic radiation measured by the Si photodiode is at least partially polarized. The experimental setup described above is shown schematically in FIG. 33A. The emission from the blue LED device alone was determined to be partially polarized with a high polarization ratio of between 0.7-0.9 for the selected LED device structure.

Figure 33B:
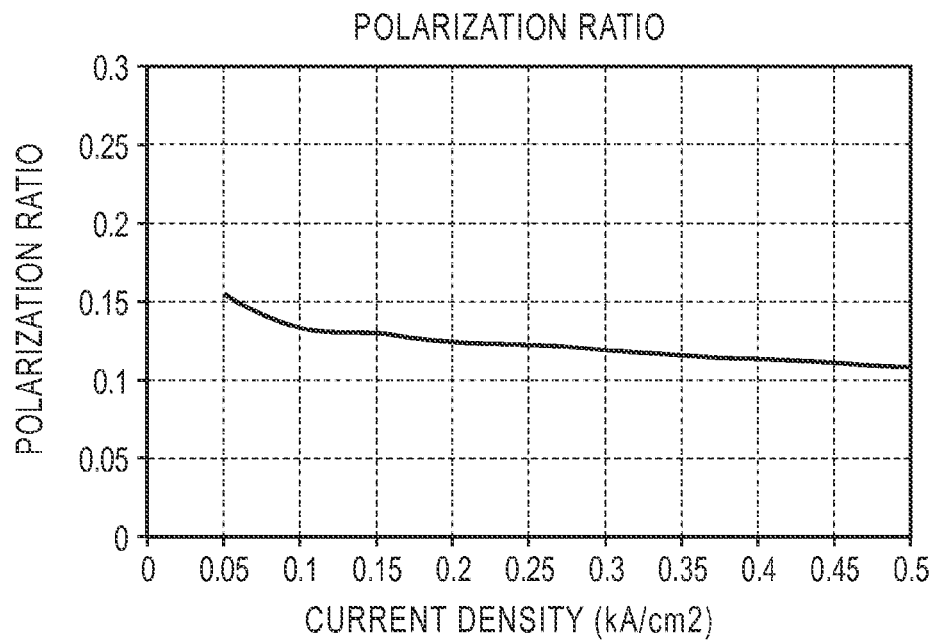
FIGS. 33B and 33C are simplified plots of experimental results illustrating polarization of emitted light for a transparent phosphor entity according to embodiments of the present invention.

FIG. 33B depicts the calculated polarization ratio for the combined emission from the LED device and the transparent polycrystalline ceramic YAG phosphor, measured in the manner described above, for a range of electrical drive currents applied to the LED device. This data clearly shows that the combined emission from the LED device and the transparent phosphor is partially polarized, thereby verifying the operation of the present method and device of the invention described in this letter by way of example.

Figure 33C:
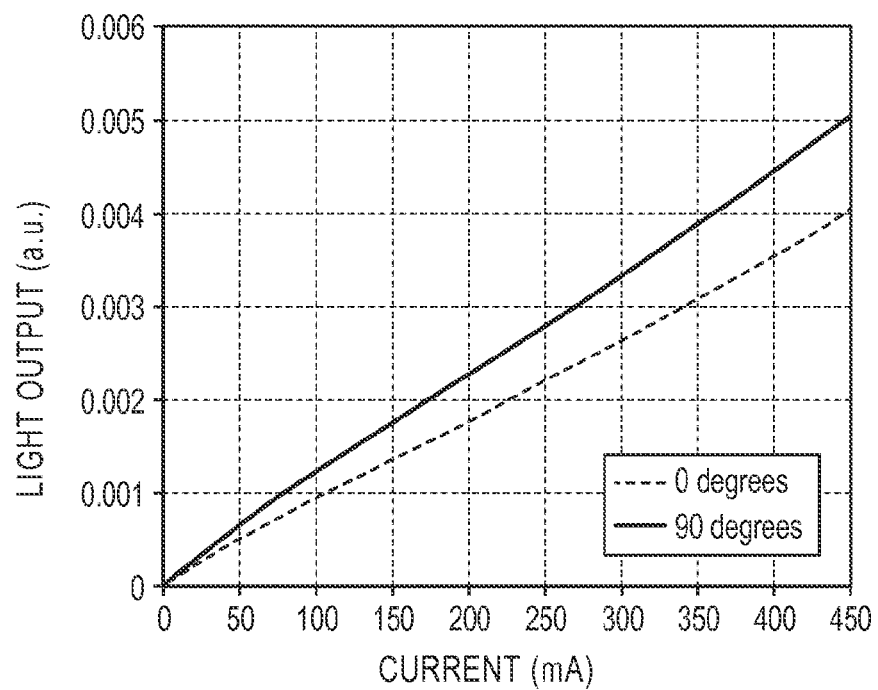

FIG. 33C additionally shows the total measured light output power for each of the two respective orientation of the polarizing filter (0 degrees and 90 degrees) as a function of drive current. The difference in measured light output power between the two alignments at a given drive current further indicates a difference in the intensity of emitted electromagnetic radiation along the two orthogonal polarization directions, thereby implying that the measured light is partially polarized. Again, we have demonstrated the operation of the present method and devices according to one or more embodiments.

Additionally, the present device can be provided in a variety of applications. In a preferred embodiment, the application is general lighting, which includes buildings for offices, housing, outdoor lighting, stadium lighting, and others. Alternatively, the applications can be for display, such as those used for computing applications, televisions, flat panels, micro-displays, and others. Still further, the applications can include automotive, gaming, and others. Of course, there can be other variations, modifications, and alternatives.

In a specific embodiment, the present devices are configured to achieve spatial uniformity. That is, diffusers can be added to the encapsulant to achieve spatial uniformity. Depending upon the embodiment, the diffusers can include $TiO_2$, $CaF_2$, $SiO_2$, $CaCO_3$, $BaSO_4$, and others, which are optically transparent and have a different index than an encapsulant causing the light to reflect, refract, and scatter to make the far field pattern more uniform. Of course, there can be other variations, modifications, and alternatives.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). In yet other embodiments, the present gallium and nitrogen containing substrate may also include other planes, e.g., c-plane. Of course, there can be other variations, modifications, and alternatives.

In one or more specific embodiments, wavelength conversion materials can be ceramic or semiconductor particle phosphors, ceramic or semiconductor plate phosphors, organic or inorganic downconverters, upconverters (anti-stokes), nanoparticles and other materials which provide wavelength conversion. Some examples are listed below
$(Sr,Ca)10(PO4)6*DB2O3:Eu2+$ (wherein 0<n^1)
$(Ba,Sr,Ca)5(PO4)3(Cl,F,Br,OH):Eu2+,Mn2+$
$(Ba,Sr,Ca)BPO5:Eu2+,Mn2+$
$Sr2Si3O8*2SrCl2:Eu2+$
$(Ca,Sr,Ba)3MgSi2O8:Eu2+, Mn2+$
$BaAl8O13:Eu2+$
$2SrO*0.84P2O5*0.16B2O3:Eu2+$
$(Ba,Sr,Ca)MgAl10O17:Eu2+,Mn2+$
$K2SiF6:Mn4+$
$(Ba,Sr,Ca)Al2O4:Eu2+$
$(Y,Gd,Lu,Sc,La)BO3:Ce3+,Tb3+$
$(Ba,Sr,Ca)2(Mg,Zn)Si2O7:Eu2+$
$(Mg,Ca,Sr,Ba,Zn)2Si1\_xO4\_2x:Eu2+$ (wherein 0<x=0.2)
$(Sr,Ca,Ba)(Al,Ga,m)2S4:Eu2+$
$(Lu,Sc,Y,Tb)2\_u\_vCevCa1+uLiwMg2\_wPw(Si,Ge)$
$3\_w012\_u/2$ where $-O.SSu^1$; $0<v£Q.1$; and $OSw^O.2$
$(Ca,Sr)8(Mg,Zn)(SiO4)4Cl2:Eu2+,Mn2+$
$Na2Gd2B2O7:Ce3+,Tb3+$
$(Sr,Ca,Ba,Mg,Zn)2P2O7:Eu2+,Mn2+$
$(Gd,Y,Lu,La)2O3:Eu3+,Bi3+$
$(Gd,Y,Lu,La)2O2S:Eu3+,Bi3+$
$(Gd,Y,Lu,La)VO4:Eu3+,Bi3+$
$(Ca,Sr)S:Eu2+,Ce3+$
$(Y,Gd,Tb,La,Sm,Pr,Lu)3(Sc,Al,Ga)5\_nO12\_3/2n:Ce3+$
(wherein 0^0^0.5)
$ZnS:Cu+,Cl\sim$
$ZnS:Cu+,Al3+$
$ZnS:Ag+,Al3+$
$SrY2S4:Eu2+$
$CaLa2S4:Ce3+$
$(Ba,Sr,Ca)MgP2O7:Eu2+,Mn2+$
$(Y,Lu)2WO6:Eu3+,Mo6+$
$CaWO4$
$(Y,Gd,La)2O2S:Eu3+$
$(Y,Gd,La)2O3:Eu3+$
$(Ca,Mg)xSyO:Ce$
$(Ba,Sr, Ca)nSinNn:Eu2+$ (wherein 2n+4=3n)
$Ca3(SiO4)Cl2:Eu2+$
$ZnS:Ag+,Cl\sim$
$(Y,Lu,Gd)2\_nCanSi4N6+nCl\_n:Ce3+$, (wherein $OSn^O.5$)
$(Lu,Ca,Li,Mg,Y)alpha-SiAlON$ doped with Eu2+ and/or Ce3+
$(Ca,Sr,Ba)SiO2N2:Eu2+,Ce3+$
$(Sr, Ca)AlSiN3:Eu2+$
$CaAlSi(ON)3:Eu2+$
$Sr10(PO4)6Cl2:Eu2+$
$(BaSi)O12N2:Eu2+$ For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

While the above is a full description of the specific embodiments, various modifications, alternative constructions and equivalents may be used. As an example, the packaged device can include any combination of elements described above, as well as outside of the present specification. Additionally, the above has been generally described in terms of one or more entities that may be one or more phosphor materials or phosphor like materials, but it would be recognized that other "energy-converting luminescent materials," which may include one or more phosphors, semiconductors, semiconductor nanoparticles ("quantum dots"), organic luminescent materials, and the like, and combinations of them, can also be used. In one or more preferred embodiments, the energy converting luminescent materials can generally be one or more wavelength converting material and/or materials or thicknesses of them. Furthermore, the above has been generally described in electromagnetic radiation that directly emits and interacts with the wavelength conversion materials, but it would be recognized that the electromagnetic radiation can be reflected and then interacts with the wavelength conversion materials or a combination of reflection and direct incident radiation. In other embodiments, the present specification describes one or more specific gallium and nitrogen containing surface orientations, but it would be recognized that any one of a plurality of family of plane orientations can be used. Of course, there can be other variations, modifications, and alternatives. Therefore, the above description and illustrations should not be taken as limiting the scope of the present invention which is defined by the appended claims.

What is claimed is:

1. A packaged light emitting device for a display application, the device comprising:
    a substrate member having a surface region, the surface region comprising an n-type contact region; at least one light emitting diode overlying the surface region, the at least one light emitting diode being fabricated on a substrate comprising semipolar or nonpolar GaN, and the at least one light emitting diode configured to emit electromagnetic radiation of a first wavelength, the at least one light emitting diode (LED) comprising an active region, the active region being provided by metal organic chemical vapor deposition, the first wavelength being a blue wavelength ranging from about 430 nanometers to about 490 nanometers;
    an optically transparent member coupled to the at least one light emitting diode;
    an optical path provided between the at least one light emitting diode and the optically transparent member; and
    a transparent phosphor having a thickness overlying the optically transparent member and configured to be excited by emission from the at least one light emitting diode to emit electromagnetic radiation of a second wavelength,
    wherein the transparent phosphor comprises multiple phosphor entities and there is a gap between the transparent phosphor and the LED.

2. The device of claim 1, wherein the optical path comprises an optical coupling material, the metal organic chemical vapor deposition being provided at atmospheric pressure and the active region comprising a multiple quantum well, and a p-type contact region formed overlying the active region, the multiple quantum well comprises an InGaN/GaN multiple quantum well to form the active region.

3. The device of claim 1, wherein the at least one light emitting diode is configured to emit substantially polarized emissions of the first wavelength.

4. The device of claim 1, wherein the transparent phosphor is configured to emit substantially polarized electromagnetic radiation of the second wavelength.

5. The device of claim 1, wherein the at least one light emitting diode comprises a quantum well region characterized by an electron wave function and a hole wave function, which are substantially overlapped within a predetermined spatial region of the quantum well region.

6. The device of claim 1, wherein the transparent phosphor is placed in close proximity to the at least one light emitting diode.

7. The device of claim 4, wherein at least one surface of the transparent phosphor is substantially flat and is parallel to the surface of the at least one light emitting diode.

8. The device of claim 4, wherein at least one surface of the transparent phosphor is substantially flat and is at an oblique angle with respect to the surface of the at least one light emitting diode.

9. The device of claim 4, wherein the transparent phosphor has a sawtooth pattern surface.

10. The device of claim 4, wherein the transparent phosphor includes a plurality of microlenses.

11. The device of claim 4, wherein the transparent phosphor includes a dome-shaped structure.

12. The device of claim 4, wherein at least one surface of the transparent phosphor is characterized by a shape configured for light extraction including both primary and secondary polarization.

13. The device of claim 1, wherein the transparent phosphor overlies a first side of the optically transparent member, the first side facing the at least one light emitting diode.

14. The device of claim 1, wherein the transparent phosphor overlies a second side of the optically transparent member, the second side facing away from the at least one light emitting diode.

15. The device of claim 1, wherein the transparent phosphor is configured to emit yellow light.

16. The device of claim 15, wherein the yellow light is substantially polarized light.

17. The device of claim 1, wherein the transparent phosphor comprises a blend of phosphors capable of emitting substantially green light and substantially red light.

18. The device of claim 17, wherein the phosphors capable of emitting substantially green light are selected from $(Ba,Sr,Ca)MgAl_{10}O_{17}:Eu^{2+},Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$ (CASI); $Na_2Gd_2B_2O_7:Ce^{3+}$; $Tb^{3+}$; $(Ba,Sr)_2(Ca,Mg,Zn)B_2O_6:K,Ce,Tb$; and a combination of any of the foregoing.

19. The device of claim 17, wherein the phosphors capable of emitting substantially red light are selected from $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4:$, where $0.05 \le x \le 0.5$, $0 \le y \le 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+},Mo^{6+}$; $(Ba,Sr,Ca)_3Mg_xSi_2O_8:Eu^{2+},Mn^{2+}$, wherein $1 < x \le 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \le x \le 1.0$, $0.01 \le y \le 1.0$; $(SrCa)_{1-x}Eu_xSi_5N_8$, where $0.01 \le x \le 0.3$; $SrZnO_2:Sm^{3+}$; $M_mO_nX$, wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; $Eu^{3+}$ activated phosphate or borate phosphors; and a combination of any of the foregoing.

20. The device of claim 17, wherein the blend of phosphor comprises at least one of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$.

21. The device of claim 1, wherein the transparent phosphor comprises a blend of phosphors capable of emitting substantially blue light, substantially green light, and substantially red light.

22. The device of claim 21, wherein the phosphors capable of emitting substantially blue light are selected from $(Ba,Sr,Ca)_5(PO_4)_3(Cl,F,Br,OH):Eu^{2+},Mn^{2+}$; $Sb^{3+}$,$(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+},Mn^{2+}$; $Sr_4Al_{14}O_{25}:Eu^{2+}$ (SAE); $BaAl_8O_{13}:Eu^{2+}$; and a combination of any of the foregoing.

23. The device of claim 21, wherein the phosphors capable of emitting substantially green light are selected from of $(Ba,Sr,Ca)MgAl_{10}O_{17}:Eu^{2+},Mn^{2+}$ (BAMn); $(Ba,Sr,Ca)Al_2O_4:Eu^{2+}$; $(Y,Gd,Lu,Sc,La)BO_3:Ce^{3+}$, $Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)$ $(SiO_4)_4Cl_2:Eu^{2+},Mn^{2+}$ (CASI); $Na_2Gd_2B_2O_7:Ce^{3+},Tb^{3+}$; $(Ba,Sr)_2(Ca,Mg,Zn)B_2O_6:K,Ce,Tb$; and a combination of any of the foregoing.

24. The device of claim 21, wherein the phosphors capable of emitting substantially red light are selected from $(Gd,Y,Lu,La)_2O_3:Eu^{3+},Bi^{3+}$; $(Gd,Y,Lu,La)_2O_2S:Eu^{3+}, Bi^{3+}$; $(Gd,Y,Lu,La)VO_4:Eu^{3+},Bi^{3+}$; $Y_2(O,S)_3:Eu^{3+}$; $Ca_{1-x}Mo_{1-y}Si_yO_4$, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+},Mn^{2+}$; $(Y,Lu)_2WO_6:Eu^{3+}, Mo^{6+}$; $(Ba,Sr,Ca)_3Mg_xSi_2O_8:Eu^{2+},Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; $Eu^{3+}$ activated phosphate or borate phosphors; and a combination of any of the foregoing.

25. The device of claim 21, wherein the transparent phosphor comprises at least one of $(Y, Gd, Tb, Sc, Lu, La)_3(Al, Ga, In)_5O_{12}:Ce^{3+}$, $SrGa_2S_4:Eu^{2+}$, and $SrS:Eu^{2+}$.

26. The device of claim 1, wherein the transparent phosphor comprises a blend of phosphors capable of emitting substantially blue light, substantially green light, substantially red light, and substantially yellow or orange light.

27. The device of claim 1, wherein the thickness of the transparent phosphor is no greater than about one millimeter.

* * * * *